(12) United States Patent
Im et al.

(10) Patent No.: US 12,452,999 B2
(45) Date of Patent: Oct. 21, 2025

(54) CIRCUIT BOARD

(71) Applicant: LG INNOTEK CO., LTD., Seoul (KR)

(72) Inventors: Seong Hwan Im, Seoul (KR); Seon Mo Gu, Seoul (KR); Ki Tae Kwon, Seoul (KR); Chang Je Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 204 days.

(21) Appl. No.: 18/033,168

(22) PCT Filed: Oct. 22, 2021

(86) PCT No.: PCT/KR2021/014971
§ 371 (c)(1),
(2) Date: Apr. 21, 2023

(87) PCT Pub. No.: WO2022/086295
PCT Pub. Date: Apr. 28, 2022

(65) Prior Publication Data
US 2023/0403787 A1    Dec. 14, 2023

(30) Foreign Application Priority Data

Oct. 22, 2020  (KR) ........................ 10-2020-0137219
Oct. 22, 2020  (KR) ........................ 10-2020-0137340

(51) Int. Cl.
*H05K 1/02* (2006.01)
*H01Q 1/38* (2006.01)

(52) U.S. Cl.
CPC ............. *H05K 1/0271* (2013.01); *H01Q 1/38* (2013.01); *H05K 2201/0191* (2013.01)

(58) Field of Classification Search
CPC .................. H05K 1/02; H05K 1/0271; H05K 2201/0191; H01Q 1/38
(Continued)

(56) References Cited

U.S. PATENT DOCUMENTS

| 11,363,711 B2 | 6/2022 | Jo et al. |
| 2007/0057363 A1 | 3/2007 | Nakamura et al. |

(Continued)

FOREIGN PATENT DOCUMENTS

| JP | 2003-8161 A | 1/2003 |
| JP | 2017-228781 A | 12/2017 |

(Continued)

*Primary Examiner* — Tremesha W Burns
(74) *Attorney, Agent, or Firm* — Birch, Stewart, Kolasch & Birch, LLP

(57) ABSTRACT

A circuit board according to an embodiment includes a first substrate layer; a second substrate layer disposed on the first substrate layer; and a third substrate layer disposed under the first substrate layer; wherein the second substrate layer includes: a first inner circuit pattern layer disposed on the first substrate layer; and a first outermost circuit pattern layer disposed on the first inner circuit pattern layer; wherein the third substrate layer includes: a second inner circuit pattern layer disposed under the first substrate layer; and a second outermost circuit pattern layer disposed under the second inner circuit pattern layer; wherein a thickness of the first outermost circuit pattern layer is greater than a thickness of each of the first inner circuit pattern layer and the second inner circuit pattern layer.

20 Claims, 9 Drawing Sheets

(58) Field of Classification Search
USPC .......................................................... 174/256
See application file for complete search history.

(56) References Cited

U.S. PATENT DOCUMENTS

| | | |
|---|---|---|
| 2008/0251279 A1 | 10/2008 | Muramatsu et al. |
| 2014/0311771 A1 | 10/2014 | Shimizu et al. |
| 2016/0374198 A1 | 12/2016 | Kim et al. |
| 2019/0166686 A1 | 5/2019 | Jo et al. |
| 2021/0191475 A1 | 6/2021 | Park et al. |

FOREIGN PATENT DOCUMENTS

| | | |
|---|---|---|
| KR | 10-2007-0028246 A | 3/2007 |
| KR | 10-2008-0049626 A | 6/2008 |
| KR | 10-2012-0005855 A | 1/2012 |
| KR | 10-2013-0057803 A | 6/2013 |
| KR | 10-2016-0149447 A | 12/2016 |
| KR | 10-2019-0012849 A | 2/2019 |
| KR | 10-2019-0062022 A | 6/2019 |
| KR | 10-2019-0065912 A | 6/2019 |

[FIG. 1]
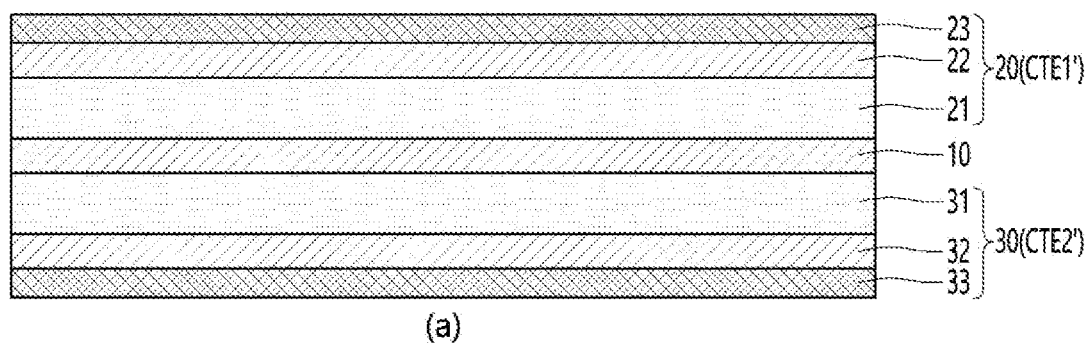
(a)
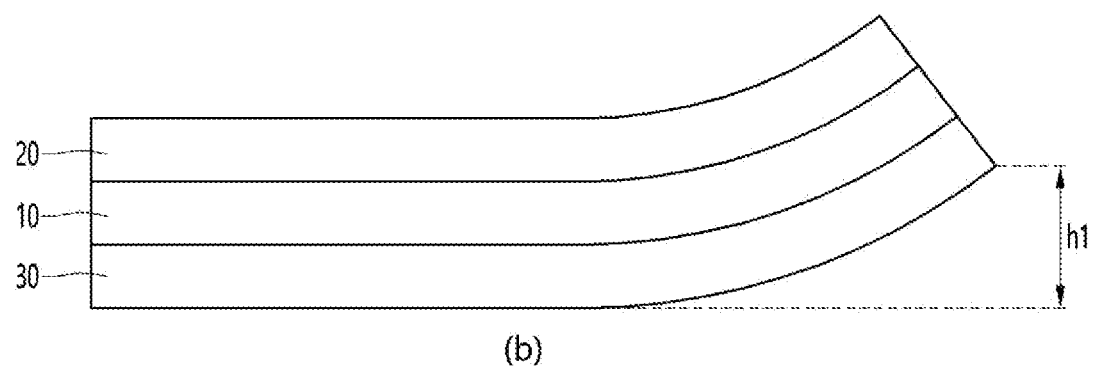
(b)

[FIG. 2]
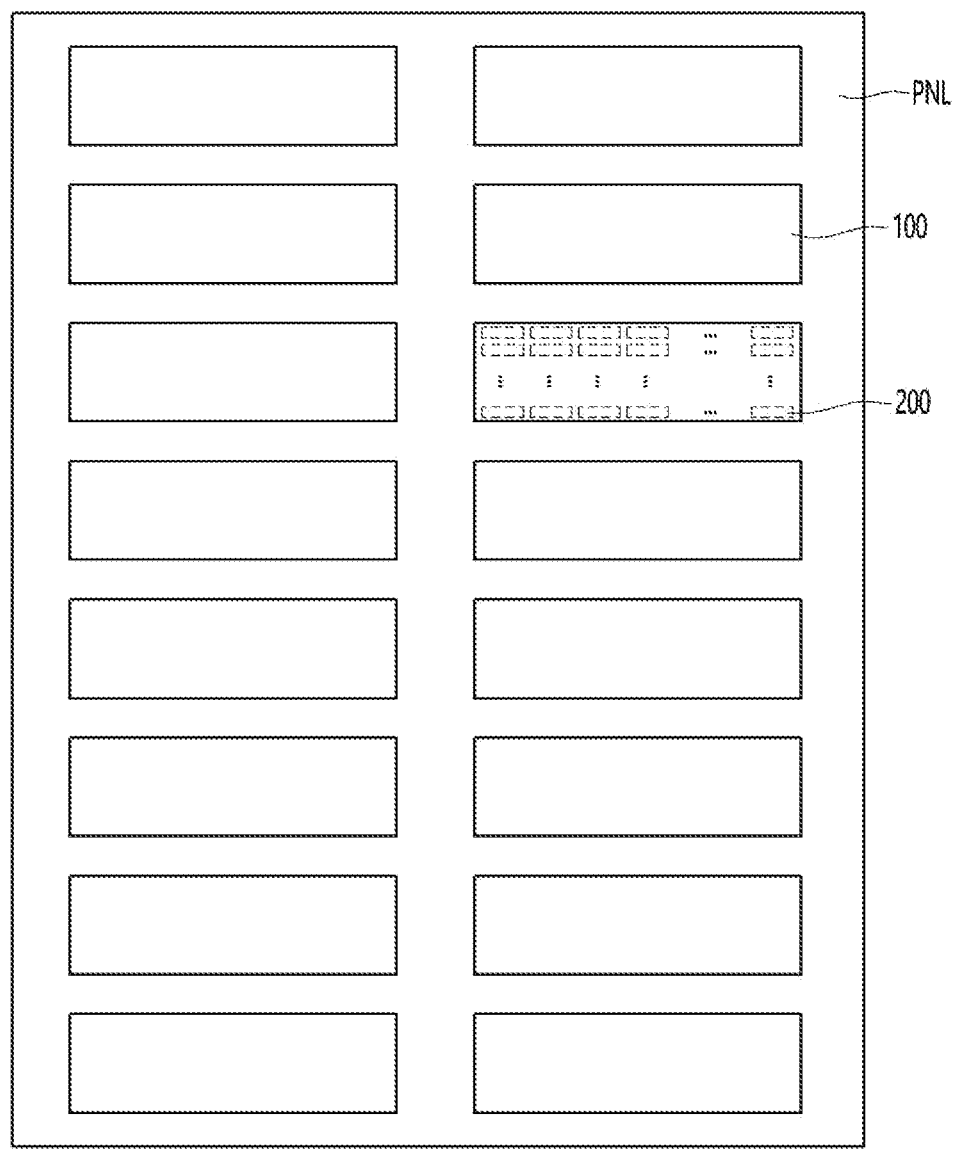

[FIG. 3]
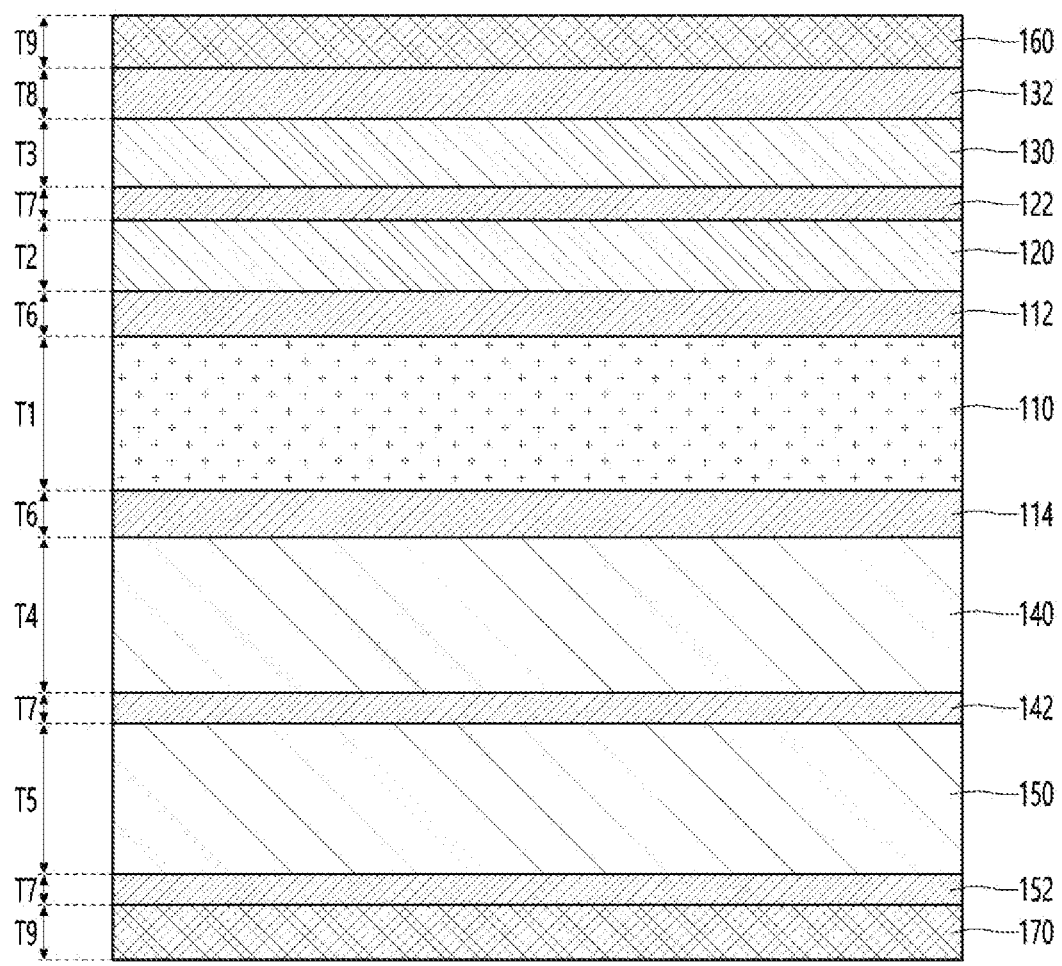

[FIG. 4]
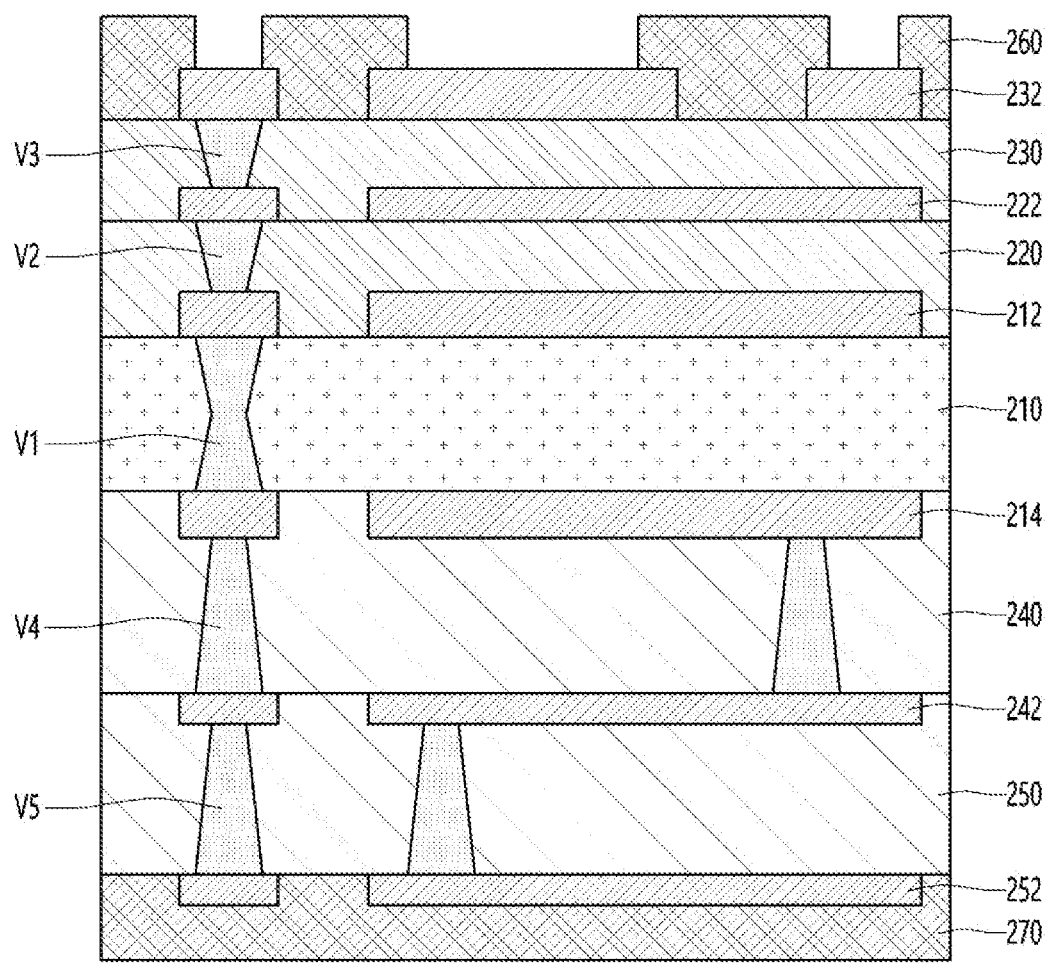

[FIG. 5]
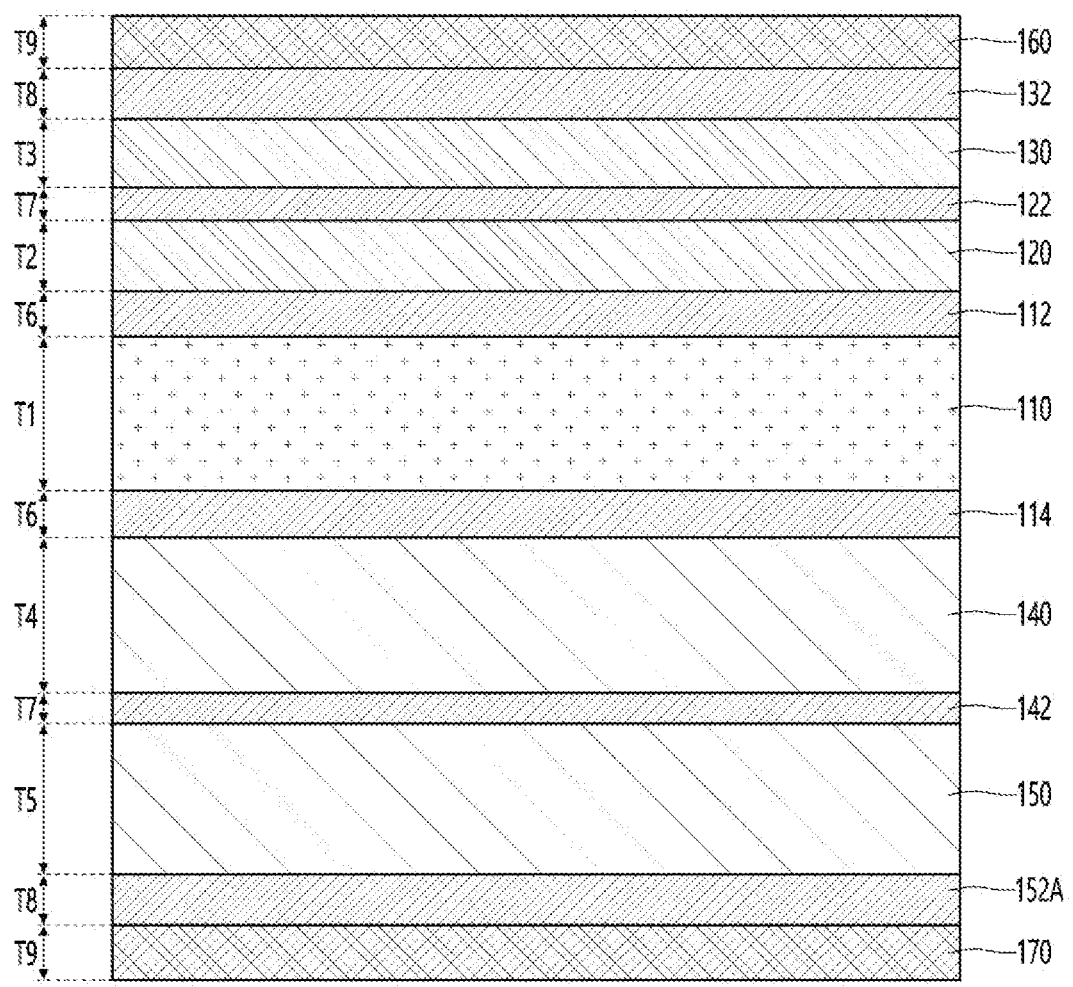

[FIG. 6]
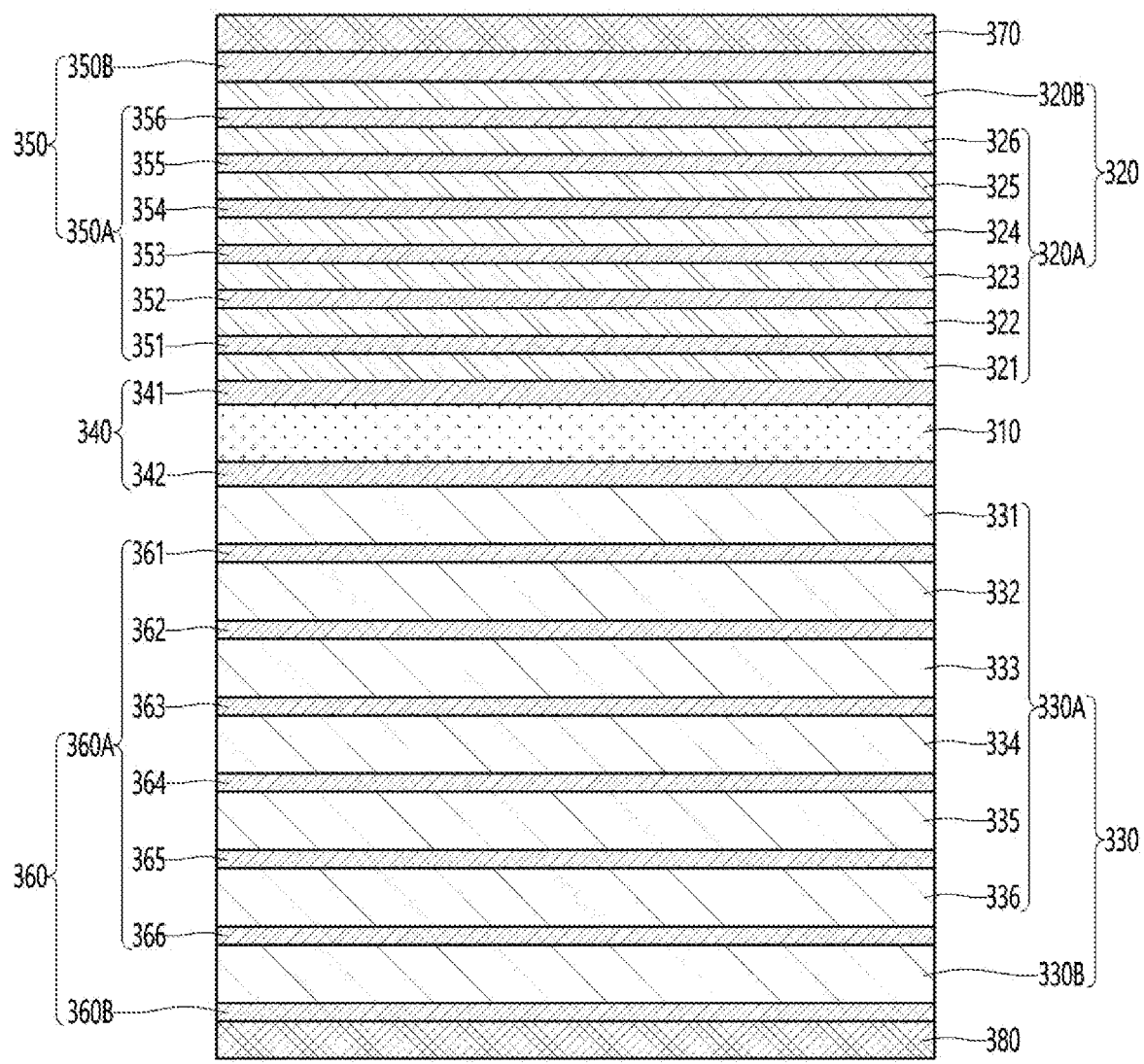

[FIG. 7]
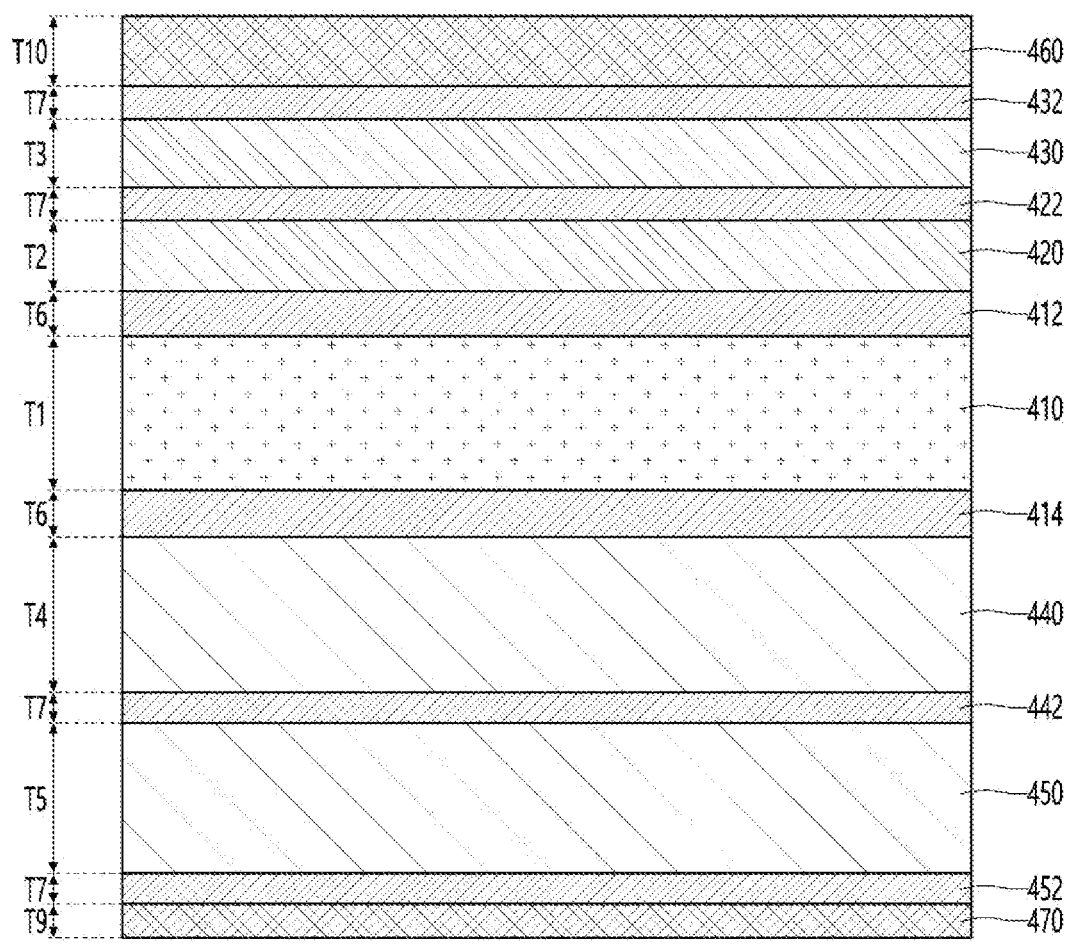

[FIG. 8]
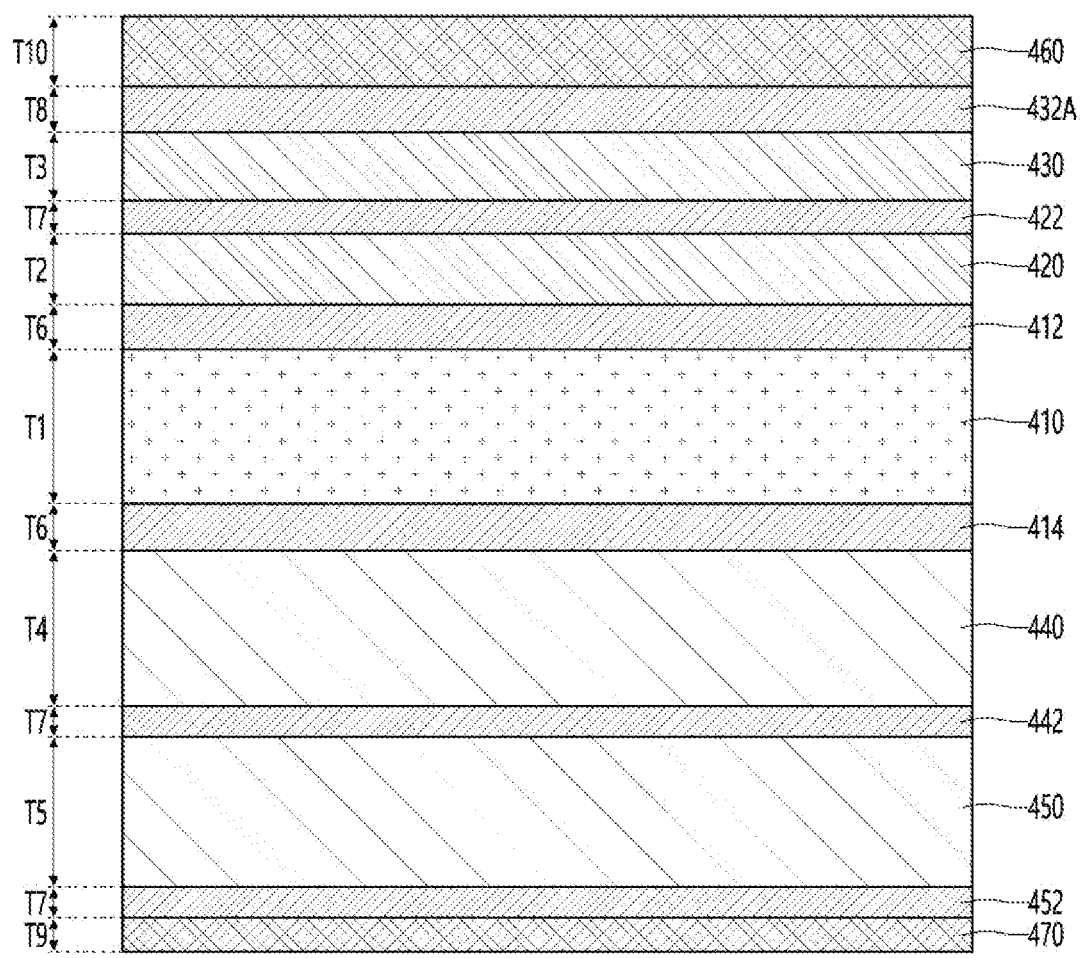

[FIG. 9]
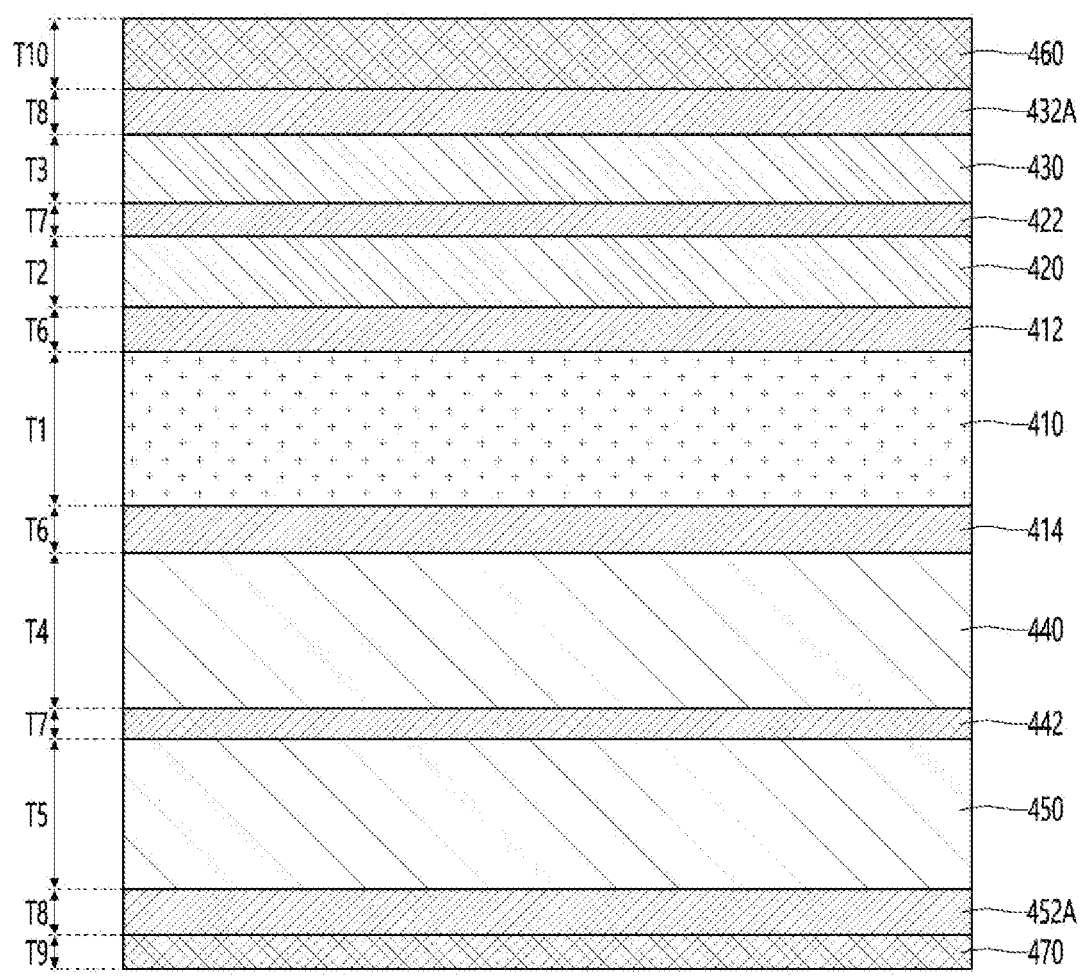

CIRCUIT BOARD

CROSS REFERENCE TO RELATED APPLICATIONS

This application is the National Phase of PCT International Application No. PCT/KR2021/014971, filed on Oct. 22, 2021, which claims priority under 35 U.S.C. 119(a) to Patent Application No. 10-2020-0137219, filed in the Republic of Korea on Oct. 22, 2020 and Patent Application No. 10-2020-0137340, filed in the Republic of Korea on Oct. 22, 2020, all of which are hereby expressly incorporated by reference into the present application.

TECHNICAL FIELD

An embodiment relates to a circuit board, and in particular, to a circuit board capable of improving a warpage property of the circuit board.

BACKGROUND ART

A printed circuit board (PCB) is a circuit board that electrically connects or mechanically fixes predetermined electronic components, and is composed of an insulating layer of phenol resin or epoxy resin, and a copper foil layer adhered to the insulating layer to form a predetermined wiring pattern.

The circuit board is broadly classified into a single-sided circuit board in which wiring is formed on only one side of the insulating layer, a double-sided circuit board in which wiring is formed on both sides of the insulating layer, and a multi-layer circuit board in which wiring is formed in multiple layers according to the number of layers.

Warpage may occur while the circuit board undergoes a heat treatment process in a process of manufacturing such a circuit board. As electronic products become smaller and thinner, the circuit board is also becoming thinner. The defect rate due to warpage can cause a bigger problem as the thinning progresses. The causes of warpage are various, such as the difference in the coefficient of thermal expansion (CTE) and the difference in the modulus of elasticity between the insulating material and the metal circuit.

In addition, recently, a plurality of circuit board units are manufactured in a strip structure formed as one to improve productivity in the process of manufacturing a substrate package, and his is commonly referred to as a circuit board strip.

In this case, the circuit board strip has circuit board units disposed in a central region, and an alignment hole for automating a strip test process or an assembly process are formed in an outer region.

In this case, when the warpage of the strip occurs in the manufacturing process of the circuit board strip, there is a problem in that an automated process such as a strip test process and an assembly process cannot be performed.

DISCLOSURE

Technical Problem

The embodiment provides a circuit board capable of improving reliability by minimizing warpage of the circuit board and a method for manufacturing the same.

In addition, the embodiment provides a circuit board capable of improving overall warpage property of the circuit board by adjusting the thickness of at least one of a circuit pattern layer and a protective layer of the circuit board.

Technical problems to be solved by the proposed embodiments are not limited to the above-mentioned technical problems, and other technical problems not mentioned may be clearly understood by those skilled in the art to which the embodiments proposed from the following descriptions belong.

Technical Solution

A circuit board according to an embodiment comprises a first substrate layer; a second substrate layer disposed on the first substrate layer; and a third substrate layer disposed under the first substrate layer; wherein the second substrate layer includes a first inner circuit pattern layer disposed on the first substrate layer; and a first outermost circuit pattern layer disposed on the first inner circuit pattern layer; wherein the third substrate layer includes a second inner circuit pattern layer disposed under the first substrate layer; and a second outermost circuit pattern layer disposed under the second inner circuit pattern layer; and a thickness of the first outermost circuit pattern layer is greater than a thickness of each of the first inner circuit pattern layer and the second inner circuit pattern layer.

In addition, the thickness of the first outermost circuit pattern layer is greater than a thickness of the second outermost circuit pattern layer.

In addition, a thickness of the second outermost circuit pattern layer is greater than the thickness of each of the first inner circuit pattern layer and the second inner circuit pattern layer.

In addition, the first inner circuit pattern layer includes a plurality spaced apart from each other in a thickness direction, and the thickness of the first outermost circuit pattern layer is greater than an average value of thicknesses of the plurality of first inner circuit pattern layers.

In addition, an average value of a plane area of the first inner circuit pattern layer and a plane area of the first outermost circuit pattern layer is greater than a planar area of the second inner circuit pattern layer and a planar area of the second outermost circuit pattern layer.

In addition, the second substrate layer includes a first inner insulating layer and a first outermost insulating layer, wherein the third substrate layer includes a second inner insulating layer and a second outermost insulating layer, wherein the first inner circuit pattern layer is disposed on the first inner insulating layer, the first outermost circuit pattern layer is disposed on the first outermost insulating layer, the second inner circuit pattern layer is disposed under the second inner insulating layer, and the second outermost circuit pattern layer is disposed under the second outermost insulating layer.

In addition, an average value of the thickness of the first inner insulating layer and the thickness of the first outermost insulating layer is smaller than an average value of the thickness of the second inner insulating layer and a thickness of the second outermost insulating layer.

In addition, an average value of a coefficient of thermal expansion of the first inner insulating layer and a coefficient of thermal expansion of the first outermost insulating layer is smaller than an average value of a coefficient of thermal expansion of the second inner insulating layer and a coefficient of thermal expansion of the second outermost insulating layer.

In addition, an average value of a dielectric constant of the first inner insulating layer and a dielectric constant of the first outermost insulating layer is smaller than an average value of a dielectric constant of the second inner insulating layer and a dielectric constant of the second outermost insulating layer.

In addition, the circuit board further comprises a first protective layer disposed on the first outermost insulating layer; and a second protective layer disposed under the second outermost insulating layer, wherein a thickness of the first protective layer is greater than a thickness of the second protective layer.

In addition, the thickness of the first protective layer has a range between 130% and 200% of the thickness of the second protective layer.

In addition, the thickness of the first protective layer satisfies a range of 16 μm to 20 μm, and the thickness of the first protective layer satisfies a range of 10 μm to 15 μm.

In addition, the thickness of the first outermost circuit pattern layer satisfies a range of 16 μm to 20 μm.

Meanwhile, the circuit board according to the embodiment is an antenna substrate including a first region and a second region under the first region, the first region of the antenna substrate is a driving part for driving an antenna part constituting the second region, the second region of the antenna substrate is operated by the driving unit and transmits a transmission signal to an outside or receives a signal transmitted from an outside, the first region includes a first circuit pattern layer including a first inner circuit pattern layer and a first outermost circuit pattern layer, the second region includes a plurality of second circuit pattern layers spaced apart from each other in a thickness direction;

a thickness of the first outermost circuit pattern layer is greater than a thickness of the first inner circuit pattern layer.

In addition, the first inner circuit pattern layer may include a plurality spaced apart from each other in a thickness direction, and a thickness of the first outermost circuit pattern layer is greater than an average value of thicknesses of the plurality of first inner circuit pattern layers.

Meanwhile, the circuit board according to the embodiment is an antenna substrate including a first region and a second region under the first region, the first region of the antenna substrate is a driving part for driving an antenna part constituting the second region; wherein the second region of the antenna substrate operates by driving the driving part, transmits a transmission signal to an outside, or receives a signal transmitted from an outside, and the first region includes a first protective layer, and the second region includes a second protective layer, wherein a thickness of the first protective layer is greater than a thickness of the second protective layer.

Advantageous Effects

The circuit board of the embodiment may be an antenna substrate. The circuit board may include a first substrate layer, a second substrate layer, and a third substrate layer. The second substrate layer may be a region corresponding to a driving part connected to a transmitting device and a receiving device in an antenna substrate. In addition, the third substrate layer may be a region corresponding to an antenna part corresponding to an antenna pattern layer for transmitting and receiving signals.

In this case, the second substrate layer of the embodiment may include a first inner circuit pattern layer and a first outermost circuit pattern layer. In addition, the third substrate layer may include a second inner circuit pattern layer and a second outermost circuit pattern layer. Here, a thickness of the first outermost circuit pattern layer of the embodiment may be greater than those of the first inner circuit pattern layer and the second inner circuit pattern layer. Specifically, a plurality of first inner circuit pattern layers may be provided, and an average thickness of a plurality of first inner circuit pattern layers may be smaller than a thickness of the first outermost circuit pattern layer. In addition, a plurality of second inner circuit pattern layers may be provided, and an average value of thicknesses of the plurality of second inner circuit pattern layers may be smaller than a thickness of the second outermost circuit pattern layer. Furthermore, a thickness of the first outermost circuit pattern layer according to the embodiment may be greater than a thickness of the second outermost circuit pattern layer.

In this embodiment, the thickness of the first outermost circuit pattern layer is greater than the thickness of the second outermost circuit pattern layer, so that the overall warpage property of the circuit board can be improved. Further, the embodiment allows the thickness of the second outermost circuit pattern layer to be greater than the thickness of other inner circuit pattern layers, so that the warpage property of the circuit board can be further improved.

Meanwhile, the circuit board of the embodiment includes a first protective layer disposed on the second substrate layer and a second protective layer disposed under the third substrate layer. In this case, the embodiment changes a thickness of the first protective layer and the second protective layer instead of changing the thickness of the first outermost circuit pattern layer and the thickness of the second outermost circuit pattern layer, so that overall warpage property of the circuit board may be improved.

For example, the thickness of the first protective layer may have a range between 130% and 200% of the thickness of the second protective layer. For example, the embodiment may allow increase the thickness of the first protective layer while fixing the thickness of the second protective layer. For example, the embodiment reduces the thickness of the second protective layer while increasing the thickness of the first protective layer. And, the embodiment can drastically reduce the overall degree of warpage of the circuit board through the change in thickness of the first protective layer and the second protective layer, thereby improving reliability.

Furthermore, the embodiment changes the thickness of the first protective layer and the second protective layer together with the thickness change of the first outermost circuit pattern layer and the second outermost circuit pattern layer, so that the warpage property of the circuit board can be maintained in a best state. Accordingly, the embodiment can maintain the flatness in a process of manufacturing the circuit board, and thereby improve the physical reliability and electrical reliability of the circuit board.

DESCRIPTION OF DRAWINGS

FIG. 1 is a diagram showing a circuit board according to a comparative example.

FIG. 2 is a view schematically showing a circuit board panel according to an embodiment.

FIG. 3 is a view schematically showing a layer structure of a circuit board according to a first embodiment.

FIG. 4 is a view showing a specific configuration of a circuit board according to a first embodiment.

FIG. 5 is a view showing a modified example of the circuit board of FIG. 3.

FIG. 6 is a view schematically showing a layer structure of a circuit board according to a second embodiment.

FIG. 7 is a view schematically showing a layer structure of a circuit board according to a third embodiment.

FIG. 8 is a view showing a layer structure of a circuit board according to a fourth embodiment.

FIG. 9 is a view showing a layer structure of a circuit board according to a fifth embodiment.

MODE FOR INVENTION

Hereinafter, the embodiment disclosed in the present specification will be described in detail with reference to the accompanying drawings, but the same or similar components are designated by the same reference numerals regardless of drawing numbers, and repeated description thereof will be omitted. The component suffixes "module" and "part" used in the following description are given or mixed together only considering the ease of creating the specification, and have no meanings or roles that are distinguished from each other by themselves. In addition, in describing the embodiments disclosed in the present specification, when it is determined that detailed descriptions of a related well-known art unnecessarily obscure gist of the embodiments disclosed in the present specification, the detailed description thereof will be omitted. Further, the accompanying drawings are merely for facilitating understanding of the embodiments disclosed in the present specification, the technological scope disclosed in the present specification is not limited by the accompanying drawings, and it should be understood as including all modifications, equivalents and alternatives that fall within the spirit and scope of the present invention.

It will be understood that, although the terms "first," "second," etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, it will be understood that there are no intervening elements present.

As used herein, a singular expression includes a plural expression, unless the context clearly indicates otherwise.

It will be understood that the terms "comprise", "include", or "have" specify the presence of stated features, integers, steps, operations, elements, components and/or groups thereof disclosed in the present specification, but do not preclude the possibility of the presence or addition of one or more other features, integers, steps, operations, elements, components, and/or groups thereof.

Hereinafter, embodiments of the present invention will be described in detail with reference to the accompanying drawings.

Comparative Example

FIG. 1 is a view showing a circuit board according to a comparative example. In this case, FIG. 1 may be a circuit board including one unit, or may be a partial region of a circuit board strip including a plurality of units.

Referring to (a) of FIG. 1, the circuit board according to the comparative example includes a first substrate layer 10, a second substrate layer 20, and a third substrate layer 30.

The circuit board according to the comparative example has a structure in which the second substrate layer 20 and the third substrate layer 30 are respectively disposed on the upper and lower sides of the first substrate layer 10 with the first substrate layer 10 interposed therebetween.

In this case, the circuit board according to the comparative example may have a three-layer structure based on the circuit pattern layer. Accordingly, the first substrate layer 10 includes a first circuit pattern layer.

In addition, the second substrate layer 20 includes a first insulating layer 21, a second circuit pattern layer 22 and a first protective layer 23 disposed on the first substrate layer 10.

In addition, the third substrate layer 30 includes a second insulating layer 31, a third circuit pattern layer 32, and a second protective layer 33 disposed below the first substrate layer 10.

In this case, the comparative example stacks each insulating layer, circuit pattern layer, and protective layer constituting the second substrate layer 20 and the third substrate layer 30 without considering the coefficient of thermal expansion of the second substrate layer 20 and the third substrate layer 30.

Here, when the second substrate layer 20 and the third substrate layer 30 have a mutually symmetrical structure based on the first substrate layer 10, a first coefficient of thermal expansion CTE1' of the second substrate layer 20 is same as a second coefficient of thermal expansion CTE2' of the third substrate layer 30.

However, the second substrate layer 20 and the third substrate layer 30 do not have a symmetric structure based on the first substrate layer 10.

That is, the designs of the second circuit pattern layer 22 of the second substrate layer 20 and the third circuit pattern layer 32 of the third substrate layer 30 are different from each other. Accordingly, a volume occupied by the second circuit pattern layer 22 in the circuit board is different from a volume occupied by the third circuit pattern layer 32. In addition, the volumes of the first insulating layer 21 and the second insulating layer 31 may also different as the volumes of the second circuit pattern layer 22 and the third circuit pattern layer 32 are different. Furthermore, a volume of the first protective layer 23 disposed on the second circuit pattern layer 22 may be different from a volume of the second protective layer 33 disposed on the third circuit pattern layers 32 as the volumes of the second circuit pattern layer 22 and the third circuit pattern layer 32 are different from each other.

For example, the second substrate layer 20 including the first insulating layer 21, the second circuit pattern layer 22, and the first protective layer 23 on the first substrate layer 10 may have a first coefficient of thermal expansion CTE1'. In addition, the third substrate layer 30 including the second insulating layer 31, the third circuit pattern layer 32, and the second protective layer 33 under the first substrate layer may have a second coefficient of thermal expansion CTE2' different from the first coefficient of thermal expansion CTE1'.

In other words, in the comparative example, the volume of each layer constituting the second substrate layer 20 and the volume of each layer constituting the third substrate layer 30 are different from each other, and the second substrate layer 20 and the third substrate layer 30 have different coefficients of thermal expansion due to the difference in volume. In addition, the warpage property of the circuit board is deteriorated because the second substrate layer 20 and the third substrate layer 30 have different coefficients of thermal expansion.

That is, the comparative example is designing the circuit board without considering the difference in the coefficients of thermal expansion between the second substrate layer 20 and the third substrate layer 30. As a result, as shown in FIG. 1(b), the circuit board in the comparative example generates a warpage in which a height of the other end is higher than a height of one end by the first height h1.

Specifically, in the comparative example, warpage may occur due to a difference in the coefficients of thermal expansion between the second substrate layer 20 and the third substrate layer 30. In this case, the first coefficient of thermal expansion CTE1' of the second substrate layer 20 may be greater than the second coefficient of thermal expansion CTE2' of the third substrate layer 30. Accordingly, the circuit board in the comparative example may generate a warpage in an upward direction having a high coefficient of thermal expansion.

In this case, when the warpage phenomenon of the circuit board occurs, a reliability problem occurs in a process of manufacturing a circuit board, and thus an automated process cannot proceed normally.

For example, when a warpage occurs on a circuit board, this may cause a problem of not forming a circuit pattern in an accurate position or not processing a through hole in an accurate position. Furthermore, when warpage of the circuit board occurs, this may cause errors in a vacuum adsorption process and a transfer process during a process of manufacturing the circuit board.

Meanwhile, in the prior art, various solutions have been proposed to solve the warpage problem of the circuit board as described above. In this case, the prior art proposes a solution considering various variables such as changing the material of each layer, changing the design of the circuit pattern layer, and changing the total number of layers of the circuit board.

However, the design of the circuit board is usually determined by a material, a dimensional specification of each layer, an error range, and a customer specified design drawing set by a customer, and accordingly, the variables to be changed in order to improve warpage in the above various variables were relatively limited.

In addition, the prior art solves the problem of warpage by changing the design of the insulating layer or the circuit pattern layer disposed inside the circuit board. However, these solutions not only complicate the process of manufacturing the circuit board, but also act as a factor that increases a manufacturing process time, and furthermore, may act as a problem that makes the automated process of the circuit board impossible.

The embodiment provides a method capable of improving the warpage property of a circuit board (eg, minimizing the occurrence of warpage) while simplifying a process of manufacturing the circuit board.

<Circuit Board Panel>

FIG. 2 is a view schematically showing a circuit board panel according to an embodiment.

Referring to FIG. 2, the circuit board may be manufactured in the form of a copper clad laminate (CCL) using a panel (PNL) as a unit.

A width of the panel PNL in a horizontal direction may have a range of 415 mm to 430 mm. In addition, a width of the panel PNL in a vertical direction may have a range of 510 mm to 550 mm. Here, the width of the panel PNL in the horizontal direction may be a width in a minor axis direction, and the width in the vertical direction may be a width in a major axis direction.

In this case, the panel PNL may be divided into a plurality of strips 100. The plurality of strips 100 may be spaced apart from each other in the horizontal and vertical directions within the panel PNL. For example, one panel PNL may be divided into 16 strips 100. That is, one panel PNL may be divided into two strip regions in a horizontal direction and eight strip regions in a vertical direction.

Accordingly, the panel PNL may include a first region in which the plurality of strips 100 are disposed and a second region excluding the first region. The second region may be a peripheral region or an outer region of the first region.

In addition, each of the plurality of strips 100 may include a plurality of units 200. For example, one strip 100 may include about 1,275 units 200. In this case, each unit 200 may have a width of 3 mm in a horizontal direction and a width of 2 mm in a vertical direction. Meanwhile, each unit 200 may constitute one circuit board. In other words, one panel PNL may be divided into 16 strips 100 and 20,400 units 200.

Meanwhile, one unit 200 may include a plurality of circuit pattern layers, a plurality of insulating layers, and a plurality of via holes VH. For example, one unit 200 may include a plurality of trapezoidal via holes VH having an upper width of 80 μm and a lower width of 60 μm. For example, one unit 200 includes about 150 via holes VH. Also, the panel PNL may include 20,400 units 200. Accordingly, one panel PNL includes more than 3 million via holes VH. In addition, a recent circuit board is required to have high integration density, and accordingly, a circuit pattern is being miniaturized and the number of via holes VH is also increasing.

Meanwhile, a process of forming at least 3 million via holes VH should be performed in the panel PNL in a process of manufacturing a circuit board in units of panels PNL. Accordingly, maintaining the flatness of the panel PNL or the strip 200 is important to improve positioning accuracy of the via hole VH in the process of forming the via hole VH. That is, a heat is applied to the panel PNL during laser processing for forming a via hole, and accordingly, a surface temperature of the panel PNL rises to a maximum of 700° C. In this case, expansion and contraction phenomena repeatedly occur in the panel PNL. In addition, warpage such as wrinkles occurs in the panel PNL due to the expansion and contraction phenomena. In this case, when the laser processing of the via hole VH proceeds in a state where the warpage has occurred, the position of the via hole VH is distorted or the shape of the via hole VH is changed. Accordingly, warpage of the panel PNL should be minimized to maintain flatness in order to minimize displacement or deformation of the via hole VH.

Accordingly, the embodiment improves the warpage property of the circuit board and, furthermore, the warpage property of the circuit board strip 100, furthermore, the warpage property of the panel PNL through a thickness change of at least one of the layers constituting the circuit board. Hereinafter, a layer to which the thickness change is applied will be described in detail. The layer whose thickness is changed may include at least one of an outermost circuit pattern layer and a protective layer.

For example, the embodiment may improve the warpage property of a circuit board by changing a thickness of at least one outermost circuit pattern layer among a plurality of outermost circuit pattern layers.

For example, the embodiment may improve the warpage property of a circuit board by changing the thickness of at least one protective layer among a plurality of protective layers.

For example, the embodiment may improve the warpage property of a circuit board by changing a thickness of at least one outermost circuit pattern layer among a plurality of outermost circuit pattern layers and at least one protective layer among a plurality of protective layers.

Hereinafter, a structure of a circuit board for each embodiment will be described.

First Embodiment

FIG. 3 is a view schematically showing a layer structure of a circuit board according to a first embodiment. In this case, FIG. 3 may be a circuit board including one unit, or may show some regions of strips of a circuit board including a plurality of units.

Referring to FIG. 3, the circuit board may have a multi-layer structure.

Specifically, the circuit board may include a first substrate layer, a second substrate layer, and a third substrate layer.

The first substrate layer may be a layer disposed inside the circuit board. For example, the first substrate layer may mean a substrate layer disposed in a center of a plurality of substrate layers disposed in a thickness direction of a circuit board.

The first substrate layer may include a first insulating layer 110, a first circuit pattern layer 112, and a second circuit pattern layer 114.

The first insulating layer 110 may refer to a core layer disposed in a center in a laminated structure of a circuit board having a plurality of layer structures, but is not limited thereto.

The first insulating layer 110 may include prepreg, but is not limited thereto. However, when the first insulating layer 110 is a core layer, the first insulating layer 110 may include a resin and glass fibers dispersed in the resin.

The first circuit pattern layer 112 is disposed on an upper surface of the first insulating layer 110, and the second circuit pattern layer 114 is disposed under a lower surface of the first insulating layer 110. The first circuit pattern layer 112 and the second circuit pattern layer 114 may include a plurality of circuit patterns (or wires, not shown) that transmit electrical signals. The first circuit pattern layer 112 and the second circuit pattern layer 114 may be formed of a metal material having high electrical conductivity. For this, the first circuit pattern layer 112 and the second circuit pattern layer 114 may be formed of at least one metal material selected from among gold (Au), silver (Ag), platinum (Pt), titanium (Ti), tin (Sn), copper (Cu), and zinc (Zn). In addition, the first circuit pattern layer 112 and the second circuit pattern layer 114 may be formed of paste or solder paste including at least one metal material selected from among gold (Au), silver (Ag), platinum (Pt), titanium (Ti), tin (Sn), copper (Cu), and zinc (Zn), which are excellent in bonding strength. Preferably, the first circuit pattern layer 112 and the second circuit pattern layer 114 may be formed of copper (Cu) having high electrical conductivity and a relatively low cost.

The first circuit pattern layer 112 and the second circuit pattern layer 114 may be formed by an additive process, a subtractive process, a modified semi additive process (MSAP), and a semi additive process (SAP) process, which are typical circuit board manufacturing processes. and a detailed description thereof will be omitted here.

A second substrate layer may be disposed over the first substrate layer. For example, the second substrate layer may be disposed on the first circuit pattern layer 112 of the first substrate layer. The second substrate layer may include a plurality of insulating layers and a plurality of circuit pattern layers.

For example, the second substrate layer may include a second insulating layer 120 and a third insulating layer 130. For example, the second substrate layer may include a third circuit pattern layer 122 disposed on an upper surface of the second insulating layer 120 and a fourth circuit pattern layer 132 disposed on an upper surface of the third insulating layer 130.

The second insulating layer 120 may be disposed on the first insulating layer 110 and the first circuit pattern layer 112. For example, the second insulating layer 120 may be disposed on the first insulating layer 110 while covering the first circuit pattern layer 112.

In addition, the third circuit pattern layer 122 may be disposed on the second insulating layer 120. Preferably, the third circuit pattern layer 122 may protrude on an upper surface of the second insulating layer 120.

In addition, the third insulating layer 130 may be disposed on the second insulating layer 120 and the third circuit pattern layer 122. Preferably, the third insulating layer 130 may be disposed on the second insulating layer 120 while covering the third circuit pattern layer 122. The third insulating layer 130 may be a first outermost insulating layer disposed on an uppermost side in a laminated structure of the circuit board.

The fourth circuit pattern layer 132 may be disposed on the third insulating layer 130. For example, the fourth circuit pattern layer 132 may protrude on an upper surface of the third insulating layer 130. The fourth circuit pattern layer 132 may be a first outermost circuit pattern layer disposed on an uppermost side in the laminated structure of the circuit board.

In addition, it is shown in the drawing that only the second insulating layer 120 of one layer is disposed between the first insulating layer 110 and the third insulating layer 130 of the first outermost insulating layer, but, it is not limited thereto. For example, a plurality of second insulating layers and a plurality of third circuit pattern layers on the plurality of second insulating layers may be disposed between the first insulating layer 110 and the third insulating layer 130 according to the number of layers of the circuit board of the embodiment.

A third substrate layer may be disposed under the first substrate layer. For example, the third substrate layer may be disposed under lower surfaces of the first insulating layer 110 and the second circuit pattern layer 114 of the first substrate layer. The third substrate layer may include a plurality of insulating layers and a plurality of circuit pattern layers.

For example, the third substrate layer may include a fourth insulating layer 140 and a fifth insulating layer 150. For example, the third substrate layer may include a fifth circuit pattern layer 142 disposed under a lower surface of the fourth insulating layer 140 and a sixth circuit pattern layer 152 disposed on the lower surface of the fifth insulating layer 150.

The fourth insulating layer 140 may be disposed under the first insulating layer 110 and the second circuit pattern layer 114. Preferably, the fourth insulating layer 140 may be disposed under the first insulating layer 110 while covering the second circuit pattern layer 114.

In addition, the fifth circuit pattern layer 142 may be disposed under the fourth insulating layer 140. Preferably, the fifth circuit pattern layer 142 may protrude under a lower surface of the fourth insulating layer 140.

In addition, the fifth insulating layer 150 may be disposed under the fourth insulating layer 140 and the fifth circuit pattern layer 142. Preferably, the fifth insulating layer 150 may be disposed under the fourth insulating layer 140 while covering the fifth circuit pattern layer 142. The fifth insulating layer 150 may be a second outermost insulating layer disposed under a lowermost side in the laminated structure of the circuit board.

For example, the sixth circuit pattern layer 152 may be disposed under the fifth insulating layer 150. For example, the sixth circuit pattern layer 152 may protrude under a lower surface of the fifth insulating layer 150. The sixth circuit pattern layer 152 may be a second outermost circuit pattern layer disposed under a lowermost side in the laminate structure of the circuit board.

In this case, it is shown in the drawing that only the fourth insulating layer 140 of one layer is disposed between the first insulating layer 110 and the fifth insulating layer 150 of the second outermost insulating layer, but it is not limited thereto. For example, a plurality of fourth insulating layers and a plurality of fifth circuit pattern layers on the plurality of fourth insulating layers may be disposed between the first insulating layer 110 and the fifth insulating layer 150 according to the number of layers of the circuit board of the embodiment.

Meanwhile, the circuit board of the embodiment may include a first protective layer 160 and a second protective layer 170.

The first protective layer 160 may be disposed on the second substrate layer. Specifically, the first protective layer 160 may be disposed on the third insulating layer 130 as the first outermost insulating layer. For example, the first protective layer 160 may be disposed on the third insulating layer 130 while covering at least a portion of the upper surface of the fourth circuit pattern layer 132 that is the first outermost circuit pattern layer.

The first protective layer 160 may serve to protect an upper surface of the third insulating layer 130, which is the first outermost insulating layer, and an upper surface of the fourth circuit pattern layer 132, which is the first outermost circuit pattern layer.

The second protective layer 170 may be disposed under the third substrate layer. Specifically, the second protective layer 170 may be disposed under the fifth insulating layer 150 that is the second outermost insulating layer. For example, the second protective layer 170 may be disposed under the fifth insulating layer 150 while covering at least a portion of a lower surface of the sixth circuit pattern layer 152, which is the second outermost circuit pattern layer.

The second protective layer 170 may serve to protect a lower surface of the fifth insulating layer 150, which is the second outermost insulating layer, and a lower surface of the sixth circuit pattern layer 152, which is the second outermost circuit pattern layer.

The first protective layer 160 and the second protective layer 170 may be a solder resist, but are not limited thereto.

The circuit board of the above embodiment may be an antenna substrate including an antenna pattern layer. To this end, a circuit board may be provided for feeding and supporting the antenna pattern layer. The circuit board may include a first region in which a driving part processing a signal to be transmitted through the antenna pattern layer or a signal received through the antenna pattern layer is disposed, and a second region in which the antenna pattern layer is disposed.

For example, the first substrate layer in the circuit board may be a reference layer for distinguishing a first region where the driving part is disposed and a second region where the antenna pattern layer is disposed.

In addition, the second substrate layer may correspond to the first region in which the driving part is disposed. In addition, the third substrate layer may correspond to the second region in which the antenna pattern layer is disposed.

For example, a transmitting device (not shown) for processing a signal to be transmitted through the antenna pattern layer and/or a receiving device (not shown) for processing a signal received through the antenna pattern layer may be disposed on the second substrate layer. For example, the third circuit pattern layer 142 disposed on the uppermost side of the second substrate layer may include a mounting pad (not shown) on which the transmitting device or the receiving device is mounted. In addition, the second insulating layer 120, the third insulating layer 130, the third circuit pattern layer 122, and the fourth circuit pattern layer 132 of the second substrate layer may be disposed between the antenna pattern layer and the transmitting element/receiving element, and may perform a communication function of transmitting a transmission signal or a reception signal.

In addition, the third substrate layer may include an antenna pattern layer. The antenna pattern layer of the third substrate layer may refer to the fifth circuit pattern layer 142 and the sixth circuit pattern layer 152 constituting the third substrate layer. The antenna pattern layer including the fifth circuit pattern layer 142 and the sixth circuit pattern layer 152 as described above may be an antenna that resonates in a plurality of resonant frequency bands. For example, the antenna pattern layer may be a dual resonant antenna that resonates in different resonant frequency bands. For example, the antenna pattern layer may be a dual resonance antenna resonating in a first frequency band of 24.03 GHz to 25.81 GHz and a second frequency band of 27.07 GHz to 28.80 GHz, respectively.

In this case, the antenna pattern layer including the fifth circuit pattern layer 142 and the sixth circuit pattern layer 152 may resonate in a resonance frequency band corresponding to a predetermined target frequency. To this end, the third substrate layer including the fifth circuit pattern layer 142 and the sixth circuit pattern layer 152 may be designed to resonate in the resonant frequency band. For example, the resonant frequency bands of the fifth circuit pattern layer 142 and the sixth circuit pattern layer 152 may change based on a dielectric constant or thickness of the fourth insulating layer 140 and the fifth insulating layer 150 constituting the third substrate layer. Accordingly, the dielectric constant or thickness of the fourth insulating layer 140 and the fifth insulating layer 150 may be determined within a range in which resonance of the fifth circuit pattern layer 142 and the sixth circuit pattern layer 152 is achieved in a target frequency band.

Accordingly, the second substrate layer and the third substrate layer of the embodiment may have an asymmetric structure. For example, the second substrate layer and the third substrate layer may have a mutually asymmetric structure based on the first substrate layer. Here, the asymmetric structure may mean that a thickness and a dielectric constant of the second substrate layer are different from a thickness and a dielectric constant of the third substrate layer.

The dielectric constant of the fourth insulating layer 140 and the fifth insulating layer 150 constituting the third substrate layer may be greater that the dielectric constant of the second insulating layer 120 and the third insulating layer 130 constituting the second substrate layer. The thickness of the fourth insulating layer 140 and the fifth insulating layer 150 constituting the third substrate layer may be greater than the thickness of the second insulating layer 120 and the third insulating layer 130 constituting the second substrate layer.

In addition, the warpage may occur in the circuit board of the embodiment during the manufacturing process, because the second substrate layer and the third substrate layer have an asymmetric structure based on the first substrate layer.

In this case, Table 1 shows the thickness of each of the first substrate layer, the second substrate layer, and the third substrate layer in the circuit board of the comparative example.

TABLE 1

|  | thickness | copper foil rate | CTE |
|---|---|---|---|
| first protective layer | 15 μm | 80% |  |
| fourth circuit pattern layer | 15 μm | 61% |  |
| third insulating layer | 20 μm | 2% | 1.55 ppm/° C. |
| third circuit pattern layer | 15 μm | 78% |  |
| second insulating layer | 20 μm | 8% | 1.41 ppm/° C. |
| first circuit pattern layer | 25 μm | 76% |  |
| first insulating layer | 100 μm | 4% |  |
| second circuit pattern layer | 25 μm | 72% |  |
| fourth insulating layer | 100 μm | 2% | 1.57 ppm/° C. |
| fifth circuit pattern layer | 15 μm | 54% |  |
| fifth insulating layer | 100 μm | 2% | 1.57 ppm/° C. |
| sixth circuit pattern layer | 15 μm | 50% |  |
| second protective layer | 15 μm | 96% |  |

Referring to Table 1, a first insulating layer of the circuit board of the comparative example may have a first thickness T1. The first insulating layer 110 is a core layer, and thus may have a relatively greater thickness than other insulating layers. For example, the first insulating layer of the comparative example may be 100 μm.

The second insulating layer and the third insulating layer of the circuit board of the comparative example may be formed on the first insulating layer to have a second thickness T2 and a third thickness T3, respectively. For example, each of the second thickness T2 and the third thickness T3 may be 20 μm.

The fourth insulating layer and the fifth insulating layer of the circuit board of the comparative example may be formed under the first insulating layer to have a fourth thickness T4 and a fifth thickness T5, respectively. For example, each of the fourth thickness T4 and the fifth thickness T5 may be 100 μm.

In addition, the first circuit pattern layer and the second circuit pattern layer of the circuit board of the comparative example may be formed on the upper and lower surfaces of the first insulating layer to have a sixth thickness T6. For example, the sixth thickness T6 may be 25 μm.

In addition, each of the third circuit pattern layer, the fourth circuit pattern layer, the fifth circuit pattern layer, and the sixth circuit pattern layer of the circuit board of the comparative example may have a seventh thickness T7. The seventh thickness T7 may be 15 μm.

In addition, the first protective layer and the second protective layer of the circuit board of the comparative example may have a ninth thickness T9. For example, the ninth thickness T9 may be 15 μm.

In this case, the thickness or dielectric constant of each insulating layer of the second substrate layer is different from the thickness or dielectric constant of each insulating layer of the third substrate layer in the circuit board of the comparison example as shown in Table 1. Furthermore, the copper foil rate (or volume) of each circuit pattern layer of the second substrate layer is different from the copper foil rate (or volume) of each circuit pattern layer of the third substrate layer in the circuit board of the comparative example as shown in Table 1. Here, the copper foil rate may mean a ratio of a plane area on which the circuit pattern layer is disposed based on a total plane area of the insulating layer.

Accordingly, warpage of the circuit board occurs due to the mutually asymmetric structure of the second substrate layer and the third substrate layer in the case of the structure of the comparative example as shown in Table 1. For example, warpage may occur in a direction in which the third substrate layer is disposed from the second substrate layer in the case of the circuit board of the comparative example shown in Table 1. For example, edge regions of the first substrate layer, the second substrate layer, and the third substrate layer generate a smile-shaped (^) warpage that is bent downward in the case of the circuit board of the comparative example.

In a structure of the circuit board according to the first embodiment, the occurrence of warpage of the circuit board can be minimized through a change in a thickness of the outermost circuit pattern layer.

In the embodiment, the warpage property according to the thickness change of the second outermost circuit pattern layer was observed while the thickness of the first outermost circuit pattern layer was fixed.

That is, Table 2 shows the degree of occurrence of warpage according to the change in the thickness of the second outermost circuit pattern layer when the thickness of the first outermost circuit pattern layer is fixed. In this case, the thickness of the circuit pattern layer of the embodiment should have a value between 10 μm and 20 μm. Table 2 shows the warpage property according to the thickness change of the second outermost circuit pattern layer in a state where the thickness of the first outermost circuit pattern layer is fixed to 15 μm.

TABLE 2

| thickness of the second outermost circuit pattern layer | degree of warpage |
|---|---|
| 10 μm | 0.40978 mm |
| 12 μm | 0.40969 mm |
| 14 μm | 0.40961 mm |
| 16 μm | 0.4095 mm |
| 18 μm | 0.4078 mm |
| 20 μm | 0.4064 mm |

In this case, the degree of warpage of the circuit board should have a value of less than 0.4 mm in order to improve the positional accuracy of the via hole or minimize the shape change in a process of manufacturing the circuit board.

As shown in Table 2, when the thickness of the second outermost circuit pattern layer changes while the thickness of the first outermost circuit pattern layer is fixed, it was confirmed that the change in the degree of warpage of the circuit board was not great.

Next, in the embodiment, the warpage property according to the thickness change of the first outermost circuit pattern layer was observed while the thickness of the second outermost circuit pattern layer was fixed.

Table 3 shows the degree of warpage according to the change in the thickness of the first outermost circuit pattern layer when the thickness of the second outermost circuit pattern layer is fixed. In this case, the thickness of the circuit pattern layer of the embodiment should have a value between 10 μm and 20 μm. Table 3 shows the degree of warpage according to the change in the thickness of the first outermost circuit pattern layer when the thickness of the second outermost circuit pattern layer is fixed to 15 μm.

TABLE 3

| Thickness of the first outermost circuit pattern layer | degree of warpage |
| --- | --- |
| 10 μm | 0.4351 mm |
| 12 μm | 0.4242 mm |
| 14 μm | 0.4095 mm |
| 16 μm | 0.3901 mm |
| 18 μm | 0.3782 mm |
| 20 μm | 0.3677 mm |

As shown in Table 3, when the thickness of the first outermost circuit pattern layer is changed while the thickness of the second outermost circuit pattern layer is fixed, it was confirmed that the change in the degree of warpage of the circuit board was larger than Table 2.

Specifically, when the thickness of the first outermost circuit pattern layer is decreased while the thickness of the second outermost circuit pattern layer is fixed, it is confirmed that the degree of warpage increases.

In addition, when the thickness of the first outermost circuit pattern layer is increased while the thickness of the second outermost circuit pattern layer is fixed, it was confirmed that the degree of warpage is decreased.

For example, when the first outermost circuit pattern layer is formed with a maximum thickness within the thickness range that the first outermost circuit pattern layer can have, it was confirmed that the degree of warpage of the circuit board was the smallest as shown in Table 3.

For example, when the first outermost circuit pattern layer is formed with a minimum thickness within the thickness range that the first outermost circuit pattern layer can have, it was confirmed that the degree of warpage of the circuit board was the greatest.

Accordingly, the embodiment increases the thickness of the first outermost circuit pattern layer within a possible range, thereby minimizing the degree of warpage of the circuit board.

In other words, the first outermost circuit pattern layer of the embodiment may have an eighth thickness T8. The eighth thickness T8 may be greater than a thickness of other circuit pattern layers on the circuit board. For example, the eighth thickness T8 may be greater than the seventh thickness T7 of the third circuit pattern layer 122, the fifth circuit pattern layer 142, and the sixth circuit pattern layer 152.

For example, the eighth thickness T8 may have a value between 16 μm and 20 μm. For example, the eighth thickness T8 may have a value between 107% and 135% of the seventh thickness T7.

In the antenna substrate of the embodiment including the second substrate layer corresponding to the driving part and the third substrate layer corresponding to the antenna part, the thickness of the first outermost circuit pattern layer disposed on the uppermost side of the circuit pattern layers corresponding to the driving part is greater than the thickness of other layers, so that it is possible to reduce the overall degree of warpage of the circuit board.

FIG. 4 is a view showing a specific configuration of a circuit board according to a first embodiment.

Referring to FIG. 4, the circuit board may include an insulating layer, a circuit pattern layer, and a protective layer corresponding to FIG. 3.

For example, the circuit board includes a first substrate layer including a first insulating layer 210, a first circuit pattern layer 212 and a second circuit pattern layer 214.

In addition, the circuit board may include a second substrate layer including a second insulating layer 220, a third circuit pattern layer 222, a third insulating layer 230, and a fourth circuit pattern layer 232 disposed on the first substrate layer. Such a second substrate layer may correspond to a driving part in an antenna substrate. For example, the driving part may function to drive an antenna part corresponding to the third substrate layer.

In addition, the circuit board may include a third substrate layer including a fourth insulating layer 240, a fifth circuit pattern layer 242, a fifth insulating layer 250, and a sixth insulating layer 252 disposed under the first substrate layer. The third substrate layer may constitute an antenna part in an antenna substrate. For example, the circuit pattern layers constituting the third substrate layer may mean an antenna pattern layer driven by the driving part.

In addition, the circuit board may include a via disposed in each insulating layer.

For example, a first via V1 may be disposed in the first insulating layer 210. The first via V1 may electrically connect the first circuit pattern layer 212 and the second circuit pattern layer 214 to each other.

For example, a first via V2 may be disposed in the second insulating layer 220. The second via V2 may electrically connect the first circuit pattern layer 212 and the third circuit pattern layer 222.

For example, a third via V3 may be disposed in the third insulating layer 230. The third via V3 may electrically connect the third circuit pattern layer 222 and the fourth circuit pattern layer 232 to each other.

For example, a fourth via V4 may be disposed in the fourth insulating layer 240. The fourth via V4 may electrically connect the second circuit pattern layer 214 and the fifth circuit pattern layer 242.

For example, a fifth via V5 may be disposed in the fifth insulating layer 250. The fifth via V5 may electrically connect the fifth circuit pattern layer 242 and the sixth circuit pattern layer 252.

The first to fifth vias V1, V2, V3, V4, and V5 may be formed by filling an inside of a via hole passing through each insulating layer with a metal material.

The via hole may be formed by a laser processing method. That is, the via hole may be formed by a via hole processing device using a $CO_2$ laser method.

In addition, the first to fifth vias V1, V2, V3, V4, and V5 may be formed by filling any one metal material selected from copper (Cu), silver (Ag), tin (Sn), gold (Au), nickel (Ni), and palladium (Pd). In this case, the filling of the metal material may use any one of electroless plating, electrolytic plating, screen printing, sputtering, evaporation, ink-jetting, and dispensing or a combination thereof.

FIG. 5 is a view showing a modified example of the circuit board of FIG. 3.

Referring to FIG. 5, the circuit board has a difference in thickness of the second outermost circuit pattern layer compared to the circuit board of FIG. 3.

That is, in the embodiment of FIG. 3, the thickness of the first outermost circuit pattern layer is greater than the thickness of each of the third circuit pattern layer 122 (eg, the first inner circuit pattern layer), the fifth circuit pattern layer 142 (eg, the second inner circuit pattern layer), and the second outermost circuit pattern layer, thereby minimizing the occurrence of warpage of the circuit board.

Here, the occurrence of warpage of the circuit board can be improved only by increasing the thickness of the first outermost circuit pattern layer.

Alternatively, when the thickness of the first outermost circuit pattern layer is increased and the thickness of the second outermost circuit pattern layer is correspondingly increased, this can further improve the occurrence of warpage of the circuit board.

Table 4 shows the degree of warpage according to the change in the thickness of the first outermost circuit pattern layer and the second outermost circuit pattern layer shown in FIG. 5.

TABLE 4

| | Thickness of the first outermost circuit pattern layer (μm) | | | | | | |
|---|---|---|---|---|---|---|---|
| | | 0 | 10 | 12 | 14 | 16 | 18 | 20 |
| Thickness | 10 | 0.5075 mm | 0.4582 mm | 0.40978 mm | 0.4012 mm | 0.3921 mm | 0.3733 mm |
| of the | 12 | 0.4871 mm | 0.4614 mm | 0.4321 mm | 0.4001 mm | 0.3910 mm | 0.3720 mm |
| second | 14 | 0.4591 mm | 0.4354 mm | 0.4210 mm | 0.4012 mm | 0.3901 mm | 0.3702 mm |
| outermost | 16 | 0.4351 mm | 0.4192 mm | 0.4095 mm | 0.3915 mm | 0.3810 mm | 0.3677 mm |
| circuit | 18 | 0.4331 mm | 0.4201 mm | 0.4075 mm | 0.3810 mm | 0.3781 mm | 0.3691 mm |
| pattern layer (μm) | 20 | 0.4315 mm | 0.4194 mm | 0.4064 mm | 0.3851 mm | 0.3751 mm | 0.3701 mm |

Before explaining Table 4, when the thickness of the second outermost circuit pattern layer is changed while the thickness of the first outermost circuit pattern layer is fixed, the degree of warpage occurred had a value of 0.4 mm or more as shown in Table 2.

In addition, when the thickness of the first outermost circuit pattern layer increases while the thickness of the second outermost circuit pattern layer is fixed, it was confirmed that there is an effect of improving warpage occurrence as shown in Table 3.

Furthermore, as shown in Table 4, it was confirmed that the warpage improvement effect under the first condition in which the thickness of the second outermost circuit pattern layer increases as the thickness of the first outermost circuit pattern layer increases is superior to the warpage improvement effect under the second condition in which the thickness of the second outermost circuit pattern layer decreases while the thickness of the first outermost circuit pattern layer increases.

Accordingly, the embodiment allows the thickness of the second outermost circuit pattern layer to have the eighth thickness T8 while the thickness of the first outermost circuit pattern layer has the eighth thickness T8.

For example, the thickness of the first outermost circuit pattern layer is greater than the thickness of the first inner circuit pattern layer in a modified example. In addition, the thickness of the second outermost circuit pattern layer is greater than that of the second inner circuit pattern layer. In this case, the thickness of the first outermost circuit pattern layer has a value between 16 μm and 20 μm. Correspondingly, the thickness of the second outermost circuit pattern layer has a value of 16 μm to 20 μm. However, when the thickness of the second outermost circuit pattern layer is smaller than the thickness of the first outermost circuit pattern layer, a best warpage improvement effect may be obtained, and accordingly, the embodiment allows the thickness of the first outermost circuit pattern layer to be greater than the thickness of the second outermost circuit pattern layer within the above range.

Second Embodiment

FIG. 6 is a view schematically showing a layer structure of a circuit board according to a second embodiment.

Referring to FIG. 6, the circuit board may have a laminated structure of 15 layers based on the number of insulating layers. For example, the circuit board may have a stacked structure of 16 layers based on the number of circuit pattern layers.

As shown in FIG. 6, the circuit board may include a first substrate layer, a second substrate layer, and a third substrate layer.

The first substrate layer may include an insulating layer 310 and a circuit pattern layer 340. The circuit pattern layer 340 may include a first circuit pattern layer 341 disposed on an upper surface of the insulating layer 310 and a second circuit pattern layer 342 disposed under a lower surface of the insulating layer 320.

A second substrate layer may be disposed on the first substrate layer. The second substrate layer may correspond to a first region in an antenna substrate where a driving part is disposed. The second substrate layer may include an insulating layer 320 and a circuit pattern layer 350. The insulating layer 320 of the second substrate layer may include a first inner insulating layer 320A and a first outermost insulating layer 320B. Specifically, the first inner insulating layer 320A includes a 1-1 inner insulating layer 321, a 1-2 inner insulating layer 322, a 1-3 inner insulating layer 323, a 1-4 inner insulating layer 324, a 1-5 inner insulating layers 325, and a 1-6 inner insulating layer 326. The first outermost insulating layer 320B may be disposed on the 1-6 inner insulating layers 326 disposed on an uppermost side of the first inner insulating layer 320A.

In addition, the circuit pattern layer 350 of the second substrate layer may include a first inner circuit pattern layer 350A and a first outermost circuit pattern layer 350B.

Specifically, the first inner circuit pattern layer 350A may include a 1-1 inner circuit pattern layer 351, a 1-2 inner circuit pattern layer 352, a 1-3 inner circuit pattern layer 353, a 1-4 inner circuit pattern layer 354, a 1-5 inner circuit pattern layer 355, and a 1-6 inner circuit pattern layer 356.

A third substrate layer may be disposed under the first substrate layer. The third substrate layer may be a second region in the antenna substrate in which an antenna part corresponding to the antenna pattern layer is disposed.

The third substrate layer may include an insulating layer 330 and a circuit pattern layer 360. The insulating layer 330 of the third substrate layer may include a second inner insulating layer 330A and a second outermost insulating layer 330B.

Specifically, the second inner insulating layer 330A may include a 2-1 inner insulating layer 331, a 2-2 inner insulating layer 332, a 2-3 inner insulating layer 333, a 2-4 inner insulating layer 334, a 2-5 inner insulating layer 335, and a 2-6 inner insulating layer 336. In addition, the second outermost insulating layer 330B may be disposed under the 2-6 inner insulating layer 336 disposed under a lowermost side of the second inner insulating layer 330A.

In addition, the circuit pattern layer 360 of the third substrate layer may include a second inner circuit pattern layer 360A and a second outermost circuit pattern layer 360B.

Specifically, the second inner circuit pattern layer 360A may include a 2-1 inner circuit pattern layer 361, a 2-2 inner circuit pattern layer 362, a 2-3 inner circuit pattern layer 363, a 2-4 inner circuit pattern layer 364, a 2-5 inner circuit pattern layer 365, and a 2-6 inner circuit pattern layer 366. In addition, the second outermost circuit pattern layer 360B may be disposed under the second outermost insulating layer 330B.

In addition, the circuit board may include a first protective layer 370 disposed on the second substrate layer and a second protective layer 380 disposed under the third substrate layer.

In this case, Table 5 shows the thickness, copper foil rate, and coefficient of thermal expansion (CTE) of each layer in the structure of FIG. 6.

TABLE 5

| | Thickness (μm) | copper foil rate (%) | CTE (ppm/° C.) |
|---|---|---|---|
| first protective layer | 15 | 80 | |
| first outermost circuit pattern layer | A | 61 | |
| first outermost insulating layer | 20 | 2 | 1.55 |
| 1-6 inner circuit pattern layer | 15 | 76 | |
| 1-6 inner insulation layer | 20 | 2 | 1.55 |
| 1-5 inner circuit pattern layer | 15 | 78 | |
| 1-5 inner insulating layer | 20 | 1 | 1.55 |
| 1-4 inner circuit pattern layer | 20 | 76 | |
| 1-4 inner insulating layer | 20 | 1 | 1.55 |
| 1-3 inner circuit pattern layer | 15 | 85 | |
| 1-3 inner insulating layer | 70 | 8 | 1.41 |
| 1-2 inner circuit pattern layer | 15 | 75 | |
| 1-2 inner insulating layer | 70 | 8 | 1.73 |
| 1-1 inner circuit pattern layer | 15 | 86 | |
| 1-1 inner insulation layer | 70 | 6 | 1.41 |
| first circuit pattern layer | 25 | 76 | |
| first insulating layer | 100 | 4 | |
| second circuit pattern layer | 25 | 72 | |
| 2-1 inner insulating layer | 70 | 2 | 1.73 |
| 2-1 inner circuit pattern layer | 15 | 35 | |
| 2-2 inner insulating layer | 100 | 2 | 1.57 |
| 2-2 inner circuit pattern layer | 15 | 36 | |
| 2-3 inner insulating layer | 100 | 2 | 1.57 |
| 2-3 inner circuit pattern layer | 15 | 54 | |
| 2-4 inner insulating layer | 100 | 2 | 1.57 |
| 2-4 inner circuit pattern layer | 15 | 52 | |
| 2-5 inner insulating layer | 70 | 1 | 1.41 |
| 2-5 inner circuit pattern layer | 15 | 36 | |
| 2-6 inner insulating layer | 100 | 2 | 1.57 |
| 2-6 inner circuit pattern layer | 15 | 45 | |
| second outermost insulating layer | 100 | 2 | 1.57 |
| second outermost circuit pattern layer | 15 | 50 | |
| second protective layer | 15 | 96 | |

Summarizing the characteristics of Table 5 the second substrate layer and the third substrate layer may have a mutually asymmetrical structure based on the first substrate layer on the circuit board. In this case, the asymmetric structure may include at least one of the thickness of the insulating layer, the coefficient of thermal expansion of the insulating layer, and the copper foil rate of the circuit pattern layer constituting the second substrate layer and the third substrate layer.

Specifically, an average value of the thicknesses of the plurality of insulating layers (the first inner insulating layer and the first outermost insulating layer) constituting the second substrate layer may be smaller than an average value of the thickness of the plurality of insulating layers (the second inner insulating layer and the second outermost insulating layer) constituting the third substrate layer. This is because the plurality of insulating layers constituting the third substrate layer constitute an antenna part, and accordingly, this allows the antenna part to have a dielectric constant of a certain level or higher so that resonance is possible in a specific resonant frequency band. Specifically, an average value of the dielectric constant of the plurality of insulating layers constituting the second substrate layer may be smaller than an average value of the dielectric constant of the plurality of insulating layers constituting the third substrate layer.

In addition, an average value of the copper foil rates of the plurality of circuit pattern layers (the first inner circuit pattern layer and the first outermost circuit pattern layer) constituting the second substrate layer may be greater than an average value of copper foil rates of a plurality of circuit pattern layers (the second inner circuit pattern layer and the second outermost circuit pattern layer) constituting the third substrate layer.

In addition, an average value of the coefficients of thermal expansion of the plurality of insulating layers (the first inner insulating layer and the first outermost insulating layer) constituting the second substrate layer may be smaller than an average value of coefficients of thermal expansion of a plurality of insulating layers (the second inner insulating layer and the second outermost insulating layer) constituting the third substrate layer.

In the above structure, when the thickness of the outermost circuit pattern layer 350B constituting the second substrate layer is increased, the overall degree of warpage of the circuit board can be improved.

For example, the comparative example allows the outermost circuit pattern layer to have the same thickness as other circuit pattern layers (eg, the first inner circuit pattern layer or the second inner circuit pattern layer).

Alternatively, the embodiment allows the outermost circuit pattern layer 350B to have a thickness greater than that of other circuit pattern layers (eg, the first inner circuit pattern layer or the second inner circuit pattern layer). Accordingly, the embodiment can improve the overall degree of warpage of the circuit board, and thereby improve reliability.

Such a circuit board can be manufactured by the following manufacturing method.

First, the embodiment may proceed with a process of forming a first substrate layer.

When the first substrate layer is formed, the embodiment may proceed with a process of forming a second substrate layer and a third substrate layer on both sides of the first substrate layer, respectively.

In this case, the process of forming the second substrate layer and the third substrate layer may include a process of forming the thickness of the outermost circuit pattern layer of the second substrates to be greater than the thickness of other circuit pattern layers.

When the second substrate layer and the third substrate layer are formed, the embodiment may proceed with a process of forming a first protective layer on the second substrate layer and forming a second protective layer under the third substrate layer.

The circuit board of the first embodiment as described above may include a first substrate layer, a second substrate layer, and a third substrate layer. The second substrate layer may be a region corresponding to a driving part connected to a transmitting device and a receiving device in an antenna substrate. In addition, the third substrate layer may be a region corresponding to an antenna part corresponding to an antenna pattern layer for transmitting and receiving signals. In this case, the second substrate layer of the embodiment may include a first inner circuit pattern layer and a first outermost circuit pattern layer. In addition, the third substrate layer may include a second inner circuit pattern layer and a second outermost circuit pattern layer. Here, a thickness of the first outermost circuit pattern layer of the embodiment may be greater than those of the first inner circuit pattern layer and the second inner circuit pattern layer. Specifically, a plurality of first inner circuit pattern layers may be provided, and an average thickness of a plurality of first inner circuit pattern layers may be smaller than a thickness of the first outermost circuit pattern layer. In addition, a plurality of second inner circuit pattern layers may be provided, and an average value of thicknesses of the plurality of second inner circuit pattern layers may be smaller than a thickness of the second outermost circuit pattern layer. In addition, a thickness of the first outermost circuit pattern layer may be greater than a thickness of the second outermost circuit pattern layer. Accordingly, the embodiment can reduce the overall degree of warpage of the circuit board, and thereby improve reliability.

Third Embodiment

Hereinafter, a circuit board according to a third embodiment will be described.

Before explaining this, the circuit board of the first and second embodiments include a first outermost circuit pattern layer having a thickness greater than that of the circuit pattern layer, so that the overall warpage property of the circuit board has been improved.

Alternatively, the warpage property is improved by changing the thicknesses of the first protective layer and the second protective layer in the circuit board of the third embodiment instead of the first and second outermost circuit pattern layers.

FIG. 7 is a view schematically showing a layer structure of a circuit board according to a third embodiment Referring to FIG. 7, an overall layer structure of the circuit board of the third embodiment may correspond to the layer structure of the circuit board of FIG. 3.

For example, the circuit board of the third embodiment may include a first substrate layer, a second substrate layer, and a third substrate layer. In addition, the circuit board of the third embodiment may include a first protective layer 460 and a second protective layer 470.

In addition, the first substrate layer may include a first insulating layer 410, a first circuit pattern layer 412, and a second circuit pattern layer 414.

In addition, the second substrate layer may include a second insulating layer 420, a third circuit pattern layer 422, a third insulating layer 430 as a first outermost insulating layer, and a fourth circuit pattern layer 432 as a first outermost circuit pattern layer.

In addition, the third substrate layer may include a fourth insulating layer 440, a fifth circuit pattern layer 442, a fifth insulating layer 450 as a second outermost insulating layer, and a sixth circuit pattern layer 452 as a second outermost circuit pattern layer.

In this case, an overall thickness of each layer of the third embodiment may correspond to a thickness of each layer of the circuit board of the first embodiment described with reference to FIG. 3.

However, in the circuit board of the third embodiment, a thickness of the first outermost circuit pattern layer and a thickness of the first protective layer 460 may be different from the thickness of the first outermost circuit pattern layer and the thickness of the first protective layer of the circuit board of the first embodiment.

For example, a thickness T7 of the first outermost circuit pattern layer may correspond to the thickness T7 of the second outermost circuit pattern layer differently from the circuit board of the first embodiment. For example, the thickness of the first outermost circuit pattern layer may correspond to the thickness of the inner circuit pattern layer.

Hereinafter, the warpage property of the circuit board when the thickness of the first protective layer 460 and the thickness of the second protective layer 470 are changed according to the third embodiment will be described.

In this case, the first protective layer and the second protective layer on the circuit board of the comparative example have the same thickness. Alternatively, the third embodiment improves the overall warpage property of the circuit board by changing the thickness of the protective layers substantially disposed on the outermost side of the circuit board.

First, when the thickness of the second protective layer 470 was changed while the thickness of the first protective layer 460 was fixed, the degree of warpage occurred was observed.

That is, Table 6 shows the degree of occurrence of warpage as the thickness of the second protective layer 470 changes while the thickness of the first protective layer 460 is fixed. In this case, the thickness of a general protective layer should have a value between 10 μm and 20 μm. Table 6 shows the degree of occurrence of warpage as the thickness of the second protective layer 470 changes in a state where the thickness of the first protective layer 460 is fixed to 15 μm.

TABLE 6

| Thickness of the second protective layer 470 | Degree of Warpage |
| --- | --- |
| 10 μm | 0.35241 mm |
| 12 μm | 0.37547 mm |
| 14 μm | 0.38942 mm |
| 16 μm | 0.4095 mm |
| 18 μm | 0.4154 mm |
| 20 μm | 0.4352 mm |

As shown in Table 6, when the thickness of the second protective layer 470 is decreased while the thickness of the first protective layer 460 is fixed, it was confirmed that the degree of warpage occurs to 4 mm or less. However, even if the thickness of the second protective layer 470 changes while the thickness of the first protective layer 460 is fixed, it was confirmed that the difference in the degree of warpage was not great.

Next, when the thickness of the first protective layer 460 was changed while the thickness of the second protective layer 470 was fixed, the degree of warpage occurred was observed. That is, Table 7 shows the degree of occurrence of warpage as the thickness of the first protective layer 460 changes while the thickness of the second protective layer 470 is fixed. Table 7 shows the degree of occurrence of warpage as the thickness of the first protective layer 460 changes in a state where the thickness of the second protective layer 470 is fixed to 15 μm.

TABLE 7

| Thickness of the first protective layer 460 | Degree of Warpage |
|---|---|
| 10 μm | 0.4924 mm |
| 12 μm | 0.4752 mm |
| 14 μm | 0.4254 mm |
| 16 μm | 0.3652 mm |
| 18 μm | 0.2592 mm |
| 20 μm | 0.2339 mm |

As shown in Table 7, when the thickness of the first protective layer 460 decreases while the thickness of the second protective layer 470 is fixed, it was confirmed that the degree of warpage of the circuit board increased.

In addition, when the thickness of the first protective layer 460 increases while the thickness of the second protective layer 470 is fixed, it was confirmed that the degree of warpage of the circuit board was greatly reduced.

For example, when the first protective layer 460 has a maximum thickness within a predetermined thickness range, it was confirmed that the degree of warpage occurred was the smallest as shown in Table 7. In addition, when the first protective layer 460 has a minimum thickness within a predetermined thickness range, it was confirmed that the degree of warpage occurred the greatest.

Accordingly, the embodiment increases the thickness of the first protective layer 460, so that the degree of warpage of the circuit board can be minimized.

Furthermore, when the thickness of the second protective layer 470 is decreased while increasing the thickness of the first protective layer 460 within a predetermined thickness range, it was confirmed that the degree of warpage of the circuit board was minimized.

In other words, when the thickness of the first protective layer 460 is greater than the thickness of the second protective layer 470 and a difference between the thickness of the first protective layer 460 and the thickness of the second protective layer 470 is great, it was confirmed that the degree of warpage occurred decreased.

Accordingly, the embodiment allows the thickness of the first protective layer 460 to be greater than the thickness of the second protective layer 470, thereby reducing the degree of warpage of the circuit board.

The first protective layer 460 of the embodiment may have a tenth thickness T10. The tenth thickness T10 may have a value between 16 μm and 20 μm.

In addition, the second protective layer 470 of the embodiment may have a ninth thickness T9. The ninth thickness T9 may be smaller than the tenth thickness T10. For example, the ninth thickness T9 may have a value between 10 μm and 15 μm.

For example, the tenth thickness T10 of the first protective layer 460 of the embodiment may have a value between 130% and 200% of the ninth thickness T9 of the second protective layer 470. When the tenth thickness T10 is less than 130% of the ninth thickness T9, the decrease in the degree of warpage may be insignificant. In addition, when the tenth thickness T10 is greater than 200% of the ninth thickness T9, the overall thickness of the circuit board may increase according to the increase in the thickness of the first protective layer 460.

The third embodiment allows the thickness of the first protective layer 460 disposed above the driving part to be greater than the thickness of the second protective layer 470 disposed below the antenna part in the antenna substrate including the second substrate layer including the driving part and the third substrate layer including the antenna part, so that it can drastically reduce the overall degree of warpage of the circuit board.

Combination of Embodiments

FIG. 8 is a view showing a layer structure of a circuit board according to a fourth embodiment, and FIG. 9 is a view showing a layer structure of a circuit board according to a fifth embodiment.

For example, a fourth embodiment may be a combination of features of the circuit board of the first embodiment shown in FIG. 3 and features of the circuit board of the third embodiment shown in FIG. 7.

For example, a fifth embodiment may be a combination of features of the circuit board of the modified example of the first embodiment shown in FIG. 5 and features of the circuit board of the third embodiment shown in FIG. 7.

Referring to FIG. 8, a thickness of the fourth circuit pattern layer 432A and/or the sixth circuit pattern layer 452A of the circuit board according to the fourth and fifth embodiments is different from that of the third embodiment of FIG. 7.

In this case, Table 8 shows the degree of occurrence of warpage as the thicknesses of the first protective layer 460, the second protective layer 470, the fourth circuit pattern layer 432A, and the sixth circuit pattern layer 452A change. The fourth circuit pattern layer 432A may be referred to as a first outermost circuit pattern layer, and the sixth circuit pattern layer 452A may be referred to as a second outermost circuit pattern layer.

TABLE 8

| Thickness of the first outermost circuit pattern layer (μm) | Thickness of the second outermost circuit pattern layer (μm) | Thickness of the first protective layer (μm) | Thickness of the second protective layer (μm) | warpage (mm) |
|---|---|---|---|---|
| 14 | 16 | 15 | 15 | 0.4095 |
|  |  | 20 | 10 | 0.2339 |
|  | 20 | 15 | 10 | 0.2438 |
|  |  | 20 | 15 | 0.3590 |
| 20 | 16 | 15 | 10 | 0.2198 |
|  |  | 20 | 15 | 0.3388 |
|  | 20 | 15 | 15 | 0.3701 |
|  |  | 20 | 10 | 0.1951 |

That is, the third embodiment allows the thickness of the first protective layer 460 to be greater than the thickness of the second protective layer 470, and primarily improves the occurrence of warpage of the circuit board.

Furthermore, the embodiment changes the thickness of the first outermost circuit pattern layer and the thickness of the second outermost circuit pattern layer as in the first embodiment and the modified example thereof while changing the thickness of the first protective layer 460 and the thickness of the second protective layer 470, so that the degree of warpage occurrence can be further improved.

As shown in Table 8, when the thickness of the first outermost circuit pattern layer increases while the thicknesses of the first protective layer 460 and the second protective layer 470 are changed, it was confirmed that the warpage property of the circuit board was further improved.

Furthermore, when the thickness of the second outermost circuit pattern layer increases together with the thickness of the first outermost circuit pattern layer in a state where the thicknesses of the first protective layer 460 and the second protective layer 470 are changed, it was confirmed that the warpage property of the circuit board was further improved.

Meanwhile, although not shown in the figure, the thickness of the first protective layer and the thickness of the second protective layer in the circuit board of the second embodiment shown in FIG. 6 may be applied as the thickness of the first protective layer and the thickness of the second protective layer of the third embodiment shown in FIG. 7.

The invention claimed is:

1. A circuit board comprising:
a first substrate layer;
a second substrate layer disposed on the first substrate layer; and
a third substrate layer disposed under the first substrate layer;
wherein the second substrate layer includes:
a first inner circuit pattern layer disposed on the first substrate layer;
a first outermost circuit pattern layer disposed on the first inner circuit pattern layer; and
a first via disposed between the first inner circuit pattern layer and the first outermost circuit pattern layer,
wherein the third substrate layer includes:
a second inner circuit pattern layer disposed under the first substrate layer;
a second outermost circuit pattern layer disposed under the second inner circuit pattern layer; and
a second via disposed between the second inner circuit pattern layer and the second outermost circuit pattern layer,
wherein a thickness of each of the first and second outermost circuit pattern layers is greater than a thickness of each of the first and second inner circuit pattern layers, and
wherein a thickness of the first outermost circuit pattern layer is different from a thickness of the second outermost circuit pattern layer.

2. The circuit board of claim 1, wherein the thickness of the first outermost circuit pattern layer is greater than a thickness of the second outermost circuit pattern layer.

3. The circuit board of claim 2, wherein the first inner circuit pattern layer includes a plurality spaced apart from each other in a thickness direction, and
wherein the thickness of the first outermost circuit pattern layer is greater than an average value of thicknesses of the plurality of first inner circuit pattern layers.

4. The circuit board of claim 1, wherein an average value of a plane area of the first inner circuit pattern layer and a plane area of the first outermost circuit pattern layer is greater than a planar area of the second inner circuit pattern layer and a planar area of the second outermost circuit pattern layer.

5. The circuit board of claim 1, wherein the second substrate layer includes a first inner insulating layer disposed on the first substrate layer and a first outermost insulating layer disposed on the first inner insulating layer,
wherein the third substrate layer includes a second inner insulating layer disposed under the first substrate layer and a second outermost insulating layer disposed under the second inner insulating layer,
wherein the first inner circuit pattern layer is disposed on the first inner insulating layer,
wherein the first outermost circuit pattern layer is disposed on the first outermost insulating layer,
wherein the second inner circuit pattern layer is disposed under the second inner insulating layer,
wherein the second outermost circuit pattern layer is disposed under the second outermost insulating layer,
wherein the first via passes through at least a portion of the first outermost insulating layer, and
wherein the second via passes through at least a portion of the second outermost insulating layer.

6. The circuit board of claim 5, wherein an average value of the thickness of the first inner insulating layer and the thickness of the first outermost insulating layer is smaller than an average value of the thickness of the second inner insulating layer and a thickness of the second outermost insulating layer.

7. The circuit board of claim 5, wherein an average value of a coefficient of thermal expansion of the first inner insulating layer and a coefficient of thermal expansion of the first outermost insulating layer is smaller than an average value of a coefficient of thermal expansion of the second inner insulating layer and a coefficient of thermal expansion of the second outermost insulating layer.

8. The circuit board of claim 5, wherein an average value of a dielectric constant of the first inner insulating layer and a dielectric constant of the first outermost insulating layer is smaller than an average value of a dielectric constant of the second inner insulating layer and a dielectric constant of the second outermost insulating layer.

9. The circuit board of claim 5, further comprising:
a first protective layer disposed on the first outermost insulating layer; and
a second protective layer disposed under the second outermost insulating layer,
wherein at least a portion of the first outermost circuit pattern layer is disposed in the first protective layer,
wherein at least a portion of the second outermost circuit pattern layer is disposed in the second protective layer, and
wherein a thickness of the first protective layer is different from a thickness of the second protective layer.

10. The circuit board of claim 9, wherein the thickness of the first protective layer is greater than the thickness of the second protective layer.

11. The circuit board of claim 9, wherein the thickness of the first protective layer has a range between 130% and 200% of the thickness of the second protective layer.

12. The circuit board of claim 9, wherein the thickness of the first protective layer satisfies a range of 16 μm to 20 μm, and
wherein the thickness of the second protective layer satisfies a range of 10 μm to 15 μm.

13. The circuit board of claim 12, wherein the thickness of the first outermost circuit pattern layer satisfies a range of 16 μm to 20 μm.

14. The circuit board of claim 6, wherein the thickness of the first inner insulating layer is smaller than the thickness of the second inner insulating layer.

15. The circuit board of claim 6, wherein the thickness of the first outermost insulating layer is smaller than the thickness of the second outermost insulating layer.

16. An antenna substrate comprising:
a circuit board including a first substrate layer, a second substrate layer disposed on the first substrate layer and a third substrate layer disposed under the first substrate layer; and
a semiconductor device mounted under the third substrate layer of the circuit board;

wherein the second substrate layer includes an antenna pattern layer including a first inner circuit pattern layer and a first outermost circuit pattern layer for transmitting and receiving an antenna signal, wherein the third substrate layer includes a driving pattern layer including a second inner circuit pattern layer and a second outermost circuit pattern layer connected to the semiconductor device and transmitting signals between the antenna pattern layer and the semiconductor device, wherein a thickness of each of the first and second outermost circuit pattern layers is greater than a thickness of each of the first and second inner circuit pattern layers, and wherein the thickness of the first outermost circuit pattern layer is greater than the thickness of the second outermost circuit pattern layer.

17. The antenna substrate of claim 16, wherein the first inner circuit pattern layer includes a plurality spaced apart from each other in a thickness direction, wherein the thickness of the first outermost circuit pattern layer is greater than an average value of thicknesses of the plurality of first inner circuit pattern layers, and wherein an average value of a plane area of the first inner circuit pattern layer and a plane area of the first outermost circuit pattern layer is greater than a planar area of the second inner circuit pattern layer and a planar area of the second outermost circuit pattern layer.

18. The antenna substrate of claim 16, wherein the second substrate layer includes a first inner insulating layer disposed on the first substrate layer and a first outermost insulating layer disposed on the first inner insulating layer, wherein the third substrate layer includes a second inner insulating layer disposed under the first substrate layer and a second outermost insulating layer disposed under the second inner insulating layer, and wherein an average value of the thickness of the first inner insulating layer and the thickness of the first outermost insulating layer is smaller than an average value of the thickness of the second inner insulating layer and a thickness of the second outermost insulating layer.

19. The antenna substrate of claim 18, wherein an average value of at least one of coefficients of thermal expansion and dielectric constants of the first inner insulating layer and the first outermost insulating layer is smaller than an average value of at least one of coefficients of thermal expansion and dielectric constants of the second inner insulating layer and the second outermost insulating layer.

20. The antenna substrate of claim 16, wherein the circuit board further includes:

a first protective layer disposed on the first outermost insulating layer; and a second protective layer disposed under the second outermost insulating layer, and wherein a thickness of the first protective layer is greater than a thickness of the second protective layer.

* * * * *